United States Patent
Hung

(10) Patent No.: US 9,287,194 B2
(45) Date of Patent: Mar. 15, 2016

(54) PACKAGING DEVICES AND METHODS FOR SEMICONDUCTOR DEVICES

(71) Applicant: Taiwan Semiconductor Manufacturing Company, Ltd., Hsin-Chu (TW)

(72) Inventor: Wensen Hung, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/787,714

(22) Filed: Mar. 6, 2013

(65) Prior Publication Data
US 2014/0252634 A1    Sep. 11, 2014

(51) Int. Cl.
| | |
|---|---|
| *H01L 23/48* | (2006.01) |
| *H01L 21/50* | (2006.01) |
| *H01L 23/16* | (2006.01) |
| *H01L 23/42* | (2006.01) |
| *H01L 23/00* | (2006.01) |
| *H01L 25/065* | (2006.01) |
| *H01L 23/373* | (2006.01) |
| *H01L 23/50* | (2006.01) |

(52) U.S. Cl.
CPC ............... *H01L 23/48* (2013.01); *H01L 23/16* (2013.01); *H01L 23/42* (2013.01); *H01L 23/3737* (2013.01); *H01L 23/50* (2013.01); *H01L 24/29* (2013.01); *H01L 24/83* (2013.01); *H01L 24/97* (2013.01); *H01L 25/0655* (2013.01); *H01L 2224/16225* (2013.01); *H01L 2224/16227* (2013.01); *H01L 2224/2929* (2013.01); *H01L 2224/29309* (2013.01); *H01L 2224/29324* (2013.01); *H01L 2224/29339* (2013.01); *H01L 2224/29347* (2013.01); *H01L 2224/29386* (2013.01); *H01L 2224/32245* (2013.01); *H01L 2224/73253* (2013.01); *H01L 2224/97* (2013.01); *H01L 2924/15311* (2013.01)

(58) Field of Classification Search
CPC ... H01L 23/34; H01L 23/373; H01L 23/3731; H01L 23/3736
USPC .................................. 257/712, 713, 717, 723
See application file for complete search history.

(56) References Cited

U.S. PATENT DOCUMENTS

| | | | | |
|---|---|---|---|---|
| 5,276,289 | A * | 1/1994 | Satoh et al. .................... | 174/260 |
| 5,720,100 | A * | 2/1998 | Skipor et al. .................... | 29/840 |
| 5,844,319 | A * | 12/1998 | Gamota et al. ................. | 257/778 |
| 5,990,418 | A * | 11/1999 | Bivona et al. ................. | 174/546 |
| 6,020,221 | A * | 2/2000 | Lim et al. ...................... | 438/125 |
| 6,046,077 | A * | 4/2000 | Baba ............................. | 438/127 |
| 6,274,214 | B1 * | 8/2001 | Chan et al. .................... | 428/40.1 |
| 6,313,521 | B1 * | 11/2001 | Baba ............................. | 257/678 |
| 6,667,557 | B2 * | 12/2003 | Alcoe et al. .................... | 257/778 |

(Continued)

OTHER PUBLICATIONS

Hutsch, T., et al., "Innovative Metal-Graphite Composites as Thermally Conducting Materials," PM2010 World Congress—PM Functional Materials—Heat Sinks, 8 pages.

*Primary Examiner* — Peniel M Gumedzoe
(74) *Attorney, Agent, or Firm* — Slater & Matsil, L.L.P.

(57) ABSTRACT

Packaging devices and methods for semiconductor devices are disclosed. In some embodiments, a packaging device for a semiconductor device includes a packaging substrate including a semiconductor device mounting region. The packaging device includes a stress isolation structure (SIS) disposed on the packaging substrate proximate a portion of a perimeter of the semiconductor device mounting region.

20 Claims, 20 Drawing Sheets

(56) References Cited

U.S. PATENT DOCUMENTS

| | | |
|---|---|---|
| 6,724,080 B1 * | 4/2004 | Ooi et al. .................. 257/704 |
| 7,002,805 B2 * | 2/2006 | Lee et al. .................. 361/704 |
| 2004/0035606 A1 * | 2/2004 | Deeney et al. ............. 174/260 |
| 2004/0057214 A1 * | 3/2004 | Alcoe et al. ............... 361/719 |
| 2004/0070058 A1 * | 4/2004 | Joshi et al. ................ 257/678 |
| 2006/0261467 A1 * | 11/2006 | Colgan et al. ............. 257/707 |
| 2010/0019377 A1 * | 1/2010 | Arvelo et al. .............. 257/712 |
| 2010/0044856 A1 * | 2/2010 | Sri-Jayantha et al. ...... 257/717 |
| 2012/0119346 A1 * | 5/2012 | Im et al. .................... 257/690 |

* cited by examiner

US 9,287,194 B2

PACKAGING DEVICES AND METHODS FOR SEMICONDUCTOR DEVICES

BACKGROUND

Semiconductor devices are used in a variety of electronic applications, such as personal computers, cell phones, digital cameras, and other electronic equipment, as examples. Semiconductor devices are typically fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components require smaller and more advanced packaging systems than packages of the past, in some applications.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging devices and methods for semiconductor devices. Novel packages for semiconductor devices that include stress isolation structures (SIS's) proximate at least a portion of a perimeter of a semiconductor device mounting region of a packaging substrate will be described herein. The SIS's may be attached to the packaging substrate before or after a semiconductor device is attached to the semiconductor device mounting region.

Figure 1:
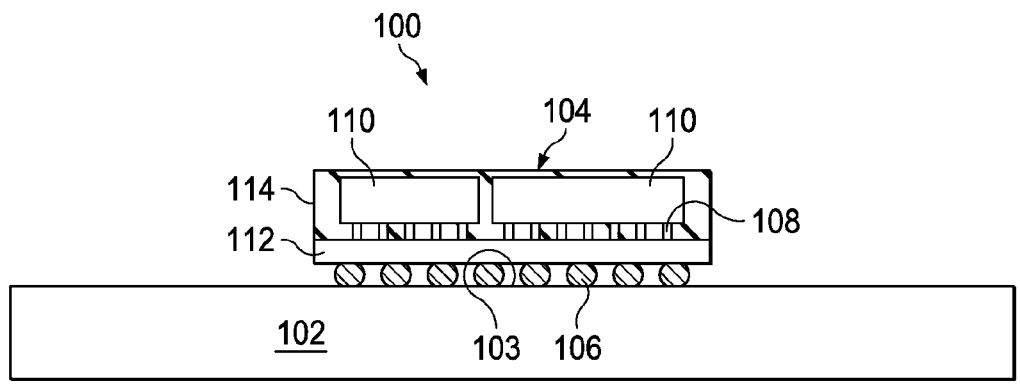
FIGS. 1, 3, 4, and 5 are cross-sectional views

FIGS. 1 through 5 illustrate a method of packaging a semiconductor device at various stages in accordance with some embodiments of the present disclosure, wherein an SIS is attached to a packaging substrate 102 after a semiconductor device 104 is attached to a semiconductor device mounting region 103. Referring first to FIG. 1, to package a semiconductor device 104, a packaging substrate 102 is provided, as shown in a cross-sectional view in FIG. 1. The packaging substrate 102 may comprise a plurality of conductive material layers and a plurality of insulating material layers, not shown. A plurality of contact pads may be mounted on a bottom surface of the packaging substrate 102 (also not shown), which may be used to electrically and mechanically connect a packaged semiconductor device 100 to another packaged semiconductor device or to a board or component in an end application, as examples. In some embodiments, the packaging substrate 102 may include a redistribution layer (RDL) that may include fan-out regions and provide horizontal electrical connections, as another example. Alternatively, the packaging substrate 102 may comprise other types of materials and configurations.

A semiconductor device 104 to be packaged is also provided. In the embodiment shown, the semiconductor device 104 includes an interposer 112 and a plurality of integrated circuit dies 110 that are coupled to a top surface of the interposer 112. Each integrated circuit die 110 includes a workpiece comprising silicon or other semiconductor materials that may be covered by an insulating layer, for example. The workpieces of the integrated circuit dies 110 may include active components or circuits, not shown, such as transistors, diodes, resistors, capacitors, etc.

The integrated circuit dies 110 are coupled to the top surface of the interposer 112 by a plurality of conductive bumps 108. The conductive bumps 108 comprise microbumps in some embodiments. Alternatively, the conductive bumps 108 may comprise other types of electrical connections. The integrated circuit dies 110 on the interposer 112 are encapsulated in a molding compound 114. The semiconductor device 104 comprises a chip on wafer (CoW) device in the embodiment shown, as an example. To form the CoW device, integrated circuit dies 110 are attached to a wafer comprising a plurality of the interposers 112. The wafer is then singulated to form a plurality of CoW devices, wherein each CoW device includes one or more of the integrated circuit dies 110 and an interposer 112. In other embodiments, the semiconductor device 104 may comprise an integrated circuit die, a through interposer stacking (TIS) device, a through transistor stacking (TTS) device, or other types of devices, to be described further herein.

The semiconductor device 104 is coupled to a semiconductor device mounting region 103 of the packaging substrate 102 by a plurality of conductive bumps 106. The conductive bumps 106 are coupled between contact pads on the interposer 112 of the semiconductive device 104 (not shown) and contact pads on the packaging substrate 102 (also not shown). In some embodiments, the conductive bumps 106 comprise controlled collapse chip connection (C4) bumps; however, the conductive bumps 106 may alternatively comprise other types of electrical connections.

Figure 2:
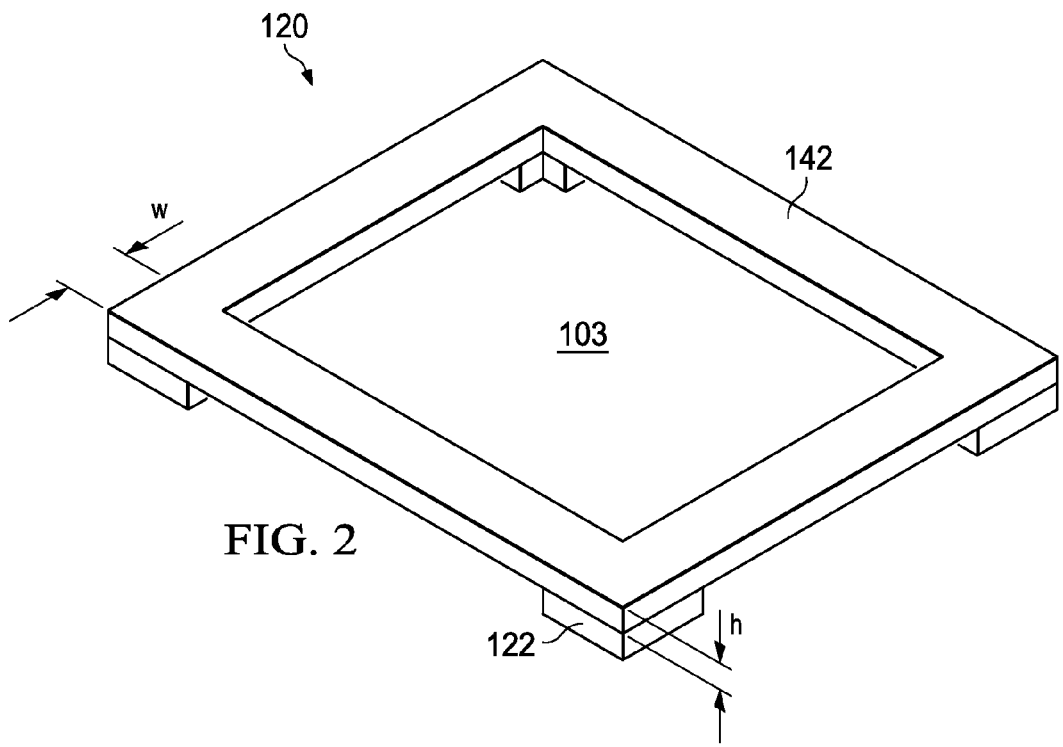
FIG. 2 is a perspective view of a method of packaging a semiconductor device at various stages in accordance with some embodiments of the present disclosure.

Next, a stress isolation structure (SIS) 120 is provided, as shown in a perspective view in FIG. 2. The SIS 120 shown in FIG. 2 comprises a continuous ring portion 142 and a plurality of downwardly extending portions 122. A downwardly extending portion 122 is located at each corner of the SIS 120 in the embodiments shown. However, alternatively, a plurality of downwardly extending portions 122 may be disposed along one or more sides of the continuous ring portion 142 of the SIS 120 in other embodiments. The SIS 120 may comprise many other shapes and configurations, to be described further herein.

The SIS 120 comprises a material having a coefficient of thermal expansion (CTE) that is close to or the substantially the same as a CTE of a material of the semiconductor device 104 in some embodiments. The SIS 120 comprises a material having a CTE that is close to or the substantially the same as silicon, in other embodiments. In yet other embodiments, the SIS 120 comprises a material having a CTE of about 2.8 parts per million degrees C. (ppm/° C.) to about 10.2 ppm/° C., as another example.

The SIS 120 comprises a ceramic-based material, a metal-based material, or a glass material, in some embodiments. The SIS 120 comprises alumina, silicon nitride, silicon carbide, a machinable ceramic material, a NiFe alloy such as Invar, a CoFeNi alloy such as Kovar, stainless steel, quartz, graphite, a composite carbon, Cu-Graphite, Cu-tungsten, Cu-alloys, or multiple layers or combinations thereof in some embodiments, as examples. Alternatively, the SIS 120 may comprise other materials. The SIS 120 comprises a height h along a portion or a side comprising about 200 μm to about 800 μm and a width w along a portion or a side comprising about 1 mm to about 3 mm in some embodiments. A length of the sides of the SIS 120 may vary as a function of a size of the semiconductor device mounting region 103 of the packaging substrate 102 upon which the semiconductor device 104 is mounted, for example. Alternatively, the SIS 120 may comprise other dimensions. The SIS 120 may be manufactured using a molding process, a machining process, mechanical forming, or a punching process, as examples. Alternatively, the SIS 120 may be manufactured using other methods.

Figure 3:
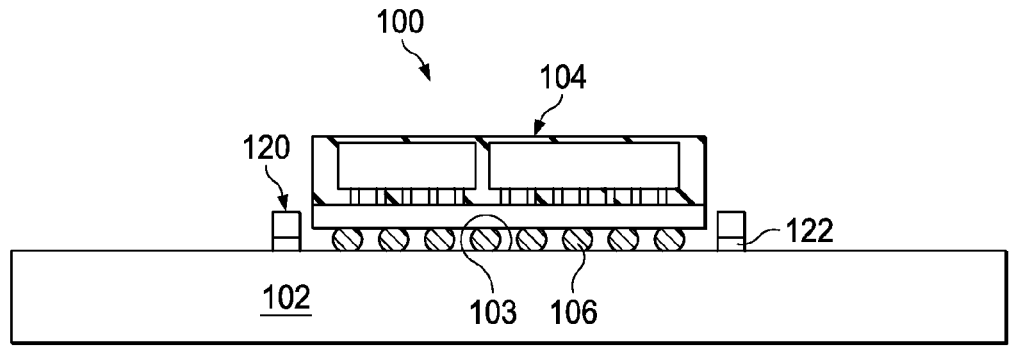

Next, the SIS 120 is coupled to or attached to the packaging substrate 102, as shown in FIG. 3. In some embodiments, an adhesive 134 or solder 138 is used to attach the SIS 120 to the packaging substrate 102 (not shown in FIG. 3; see FIGS. 8 and 14, respectively.) In the embodiment shown, a subsequently deposited underfill material 124 is used to attach the SIS 120 to the packaging substrate 102. The SIS 120 is press-fit onto the packaging substrate 102 around the semiconductor device 104 which is attached to the mounting region 103 of the packaging substrate 102. The SIS 120 may be attached manually or using a pick-and-place machine to the packaging substrate 102, as examples. The close proximity of the SIS 120 to the semiconductor device 104 maintains the position and retains the SIS 120 onto the packaging substrate 102 until the underfill material 124 is applied.

Figure 4:
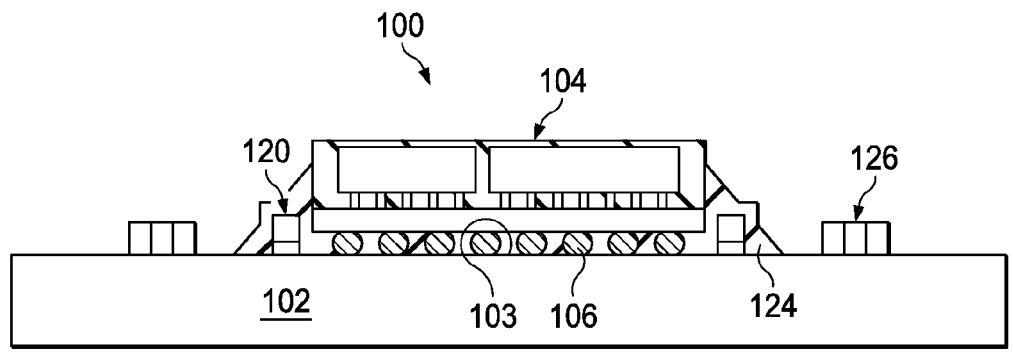

Next, the underfill material 124 is dispensed beneath the semiconductor device 104 between the conductive bumps 106, as shown in FIG. 4, and the underfill material 124 is cured. The underfill material 124 also covers at least a portion of the SIS 120 and adheres the SIS 120 to the packaging substrate 102. The underfill material 124 comprises a C4 bump underfill material, e.g., in embodiments wherein the conductive bumps 106 comprise C4 bumps. Alternatively, the underfill material 124 may comprise other types of materials. The SIS 120 is coupled to the packaging substrate 102 before forming the underfill material 124 in some embodiments, for example. Passive components 126, if included in the design, are then assembled onto the packaging substrate 102, also shown in FIG. 4.

Figure 5:
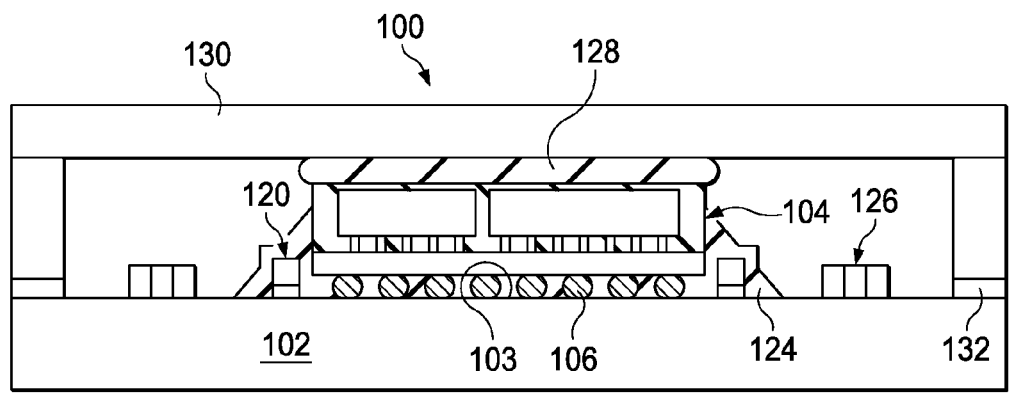

Referring next to FIG. 5, a thermal interface material (TIM) 128 is applied or dispensed onto a top surface of the semiconductor device 104. The TIM 128 comprises an epoxy, silicone, an inorganic material such as a lightly cross-linked silicone polymer, one or more matrix polymers, a polymer with one or more thermally conductive fillers, other materials, or multiple layers or combinations thereof in some embodiments, as examples. In embodiments wherein the TIM 128 comprises a matrix polymer, the matrix polymer may comprise ethylene-propylene, an ethylene-propylene-diene monomer, hydrogenated polyisoprene, or a combination thereof. In embodiments wherein the TIM 128 includes a thermally conductive filler, the thermally conductive filler may include aluminum oxide, boron nitride, aluminum nitride, aluminum, copper, silver, indium, or a combination thereof. The thermally conductive filler is dispersed within the TIM 128 and has a percentage weight within the TIM 128 of about 10 weight percent to about 90 weight percent in some embodiments, for example. Alternatively, the TIM 128 may comprise other materials, filler, and properties.

A cover 130 is coupled to a perimeter of the packaging substrate 102 by an adhesive 132, also shown in FIG. 5, and the adhesive 132 is cured. The cover 130 is also coupled to the TIM 128. In some embodiments, the packaged semiconductor device 100 comprises a chip-on-wafer-on-substrate (CoWoS) package. The packaged semiconductor device 100 advantageously has lower warpage, lower stress, and higher reliability due to the inclusion of the SIS 120 in the structure. Because the SIS 120 comprises a material having a CTE that is close to or the substantially the same as a CTE of a material of the semiconductor device 104, fewer CTE mismatch events occur for the packaged semiconductor device 100, such as global warpage of the package, underfill material 124 delamination and cracks, molding compound 114 cracks, conductive bump 106 or 108 cracks, and insulating material damage or cracks (e.g., to various insulating material layers of the semiconductor device 104, which may include low dielectric constant (k) materials having a dielectric constant of less than about 3.9). The SIS 120 advantageously prevents such effects from harmful stress caused by CTE mismatch, which can be particularly problematic in corner regions of the packaged semiconductor device 100 in some applications, for example.

Figure 6:
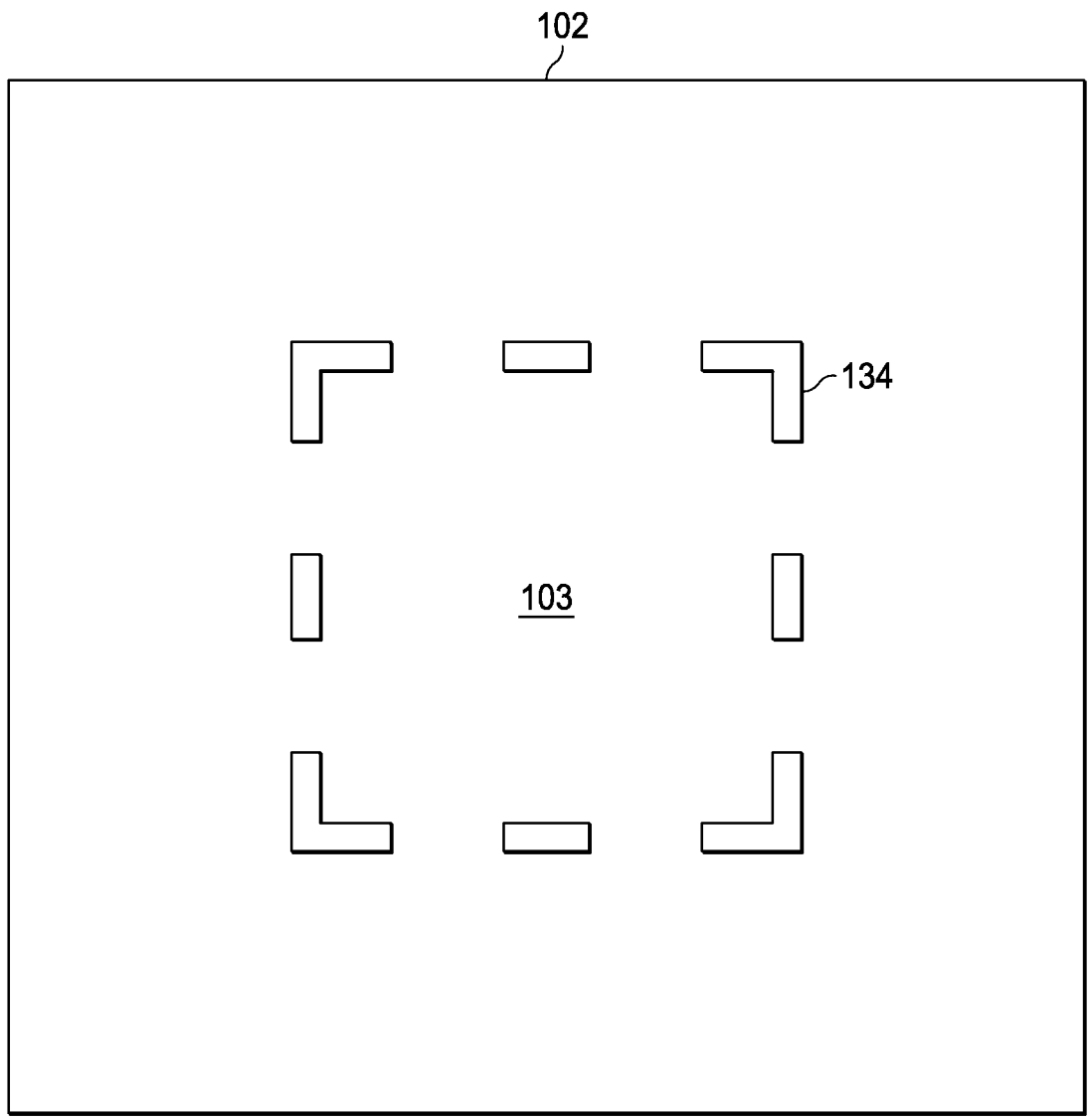
FIGS. 6, 7, and 11 are top views
Figure 7:
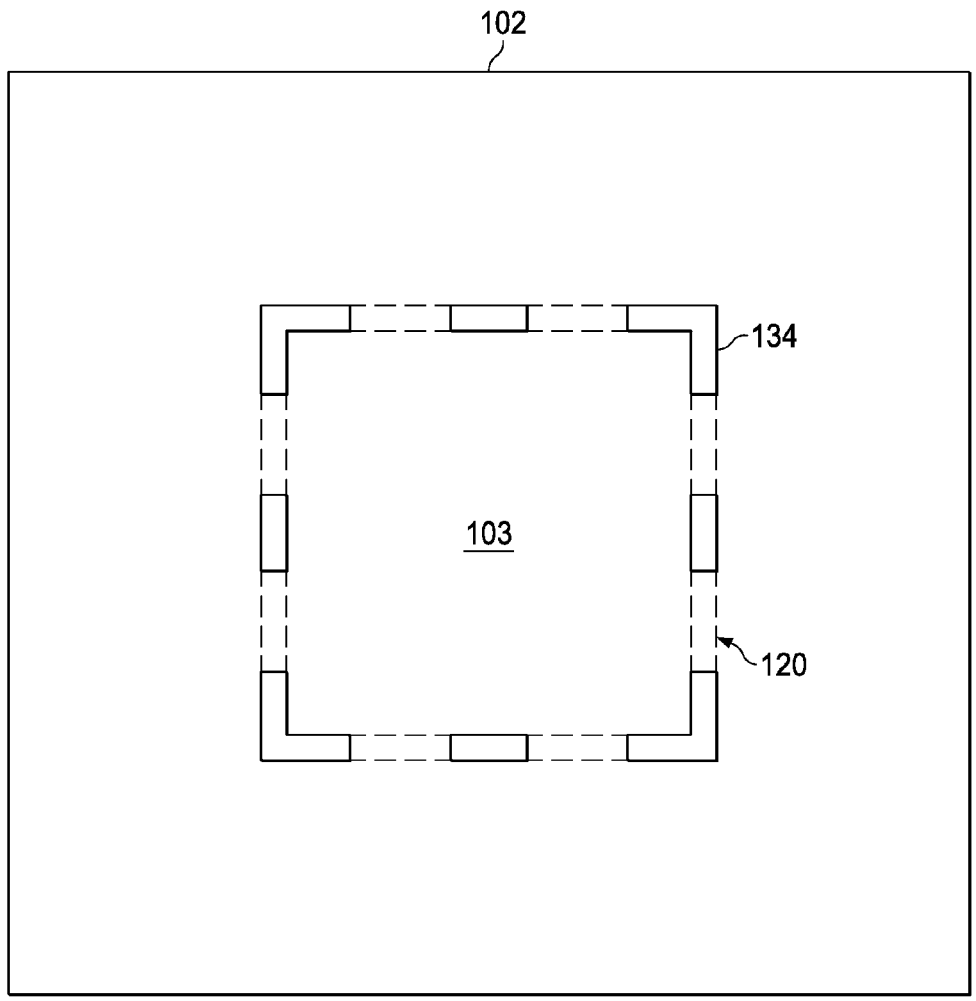
Figure 8:
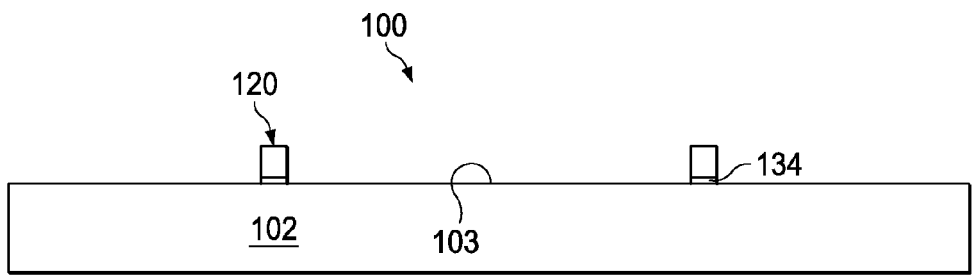
FIGS. 8, 9, 10, and 12 are cross-sectional views of a method of packaging a semiconductor device at various stages in accordance with some embodiments.
Figure 9:
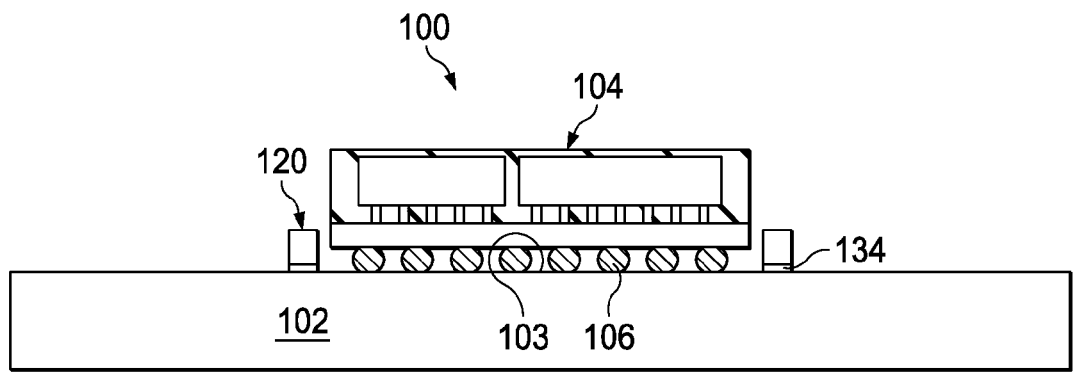
Figure 10:
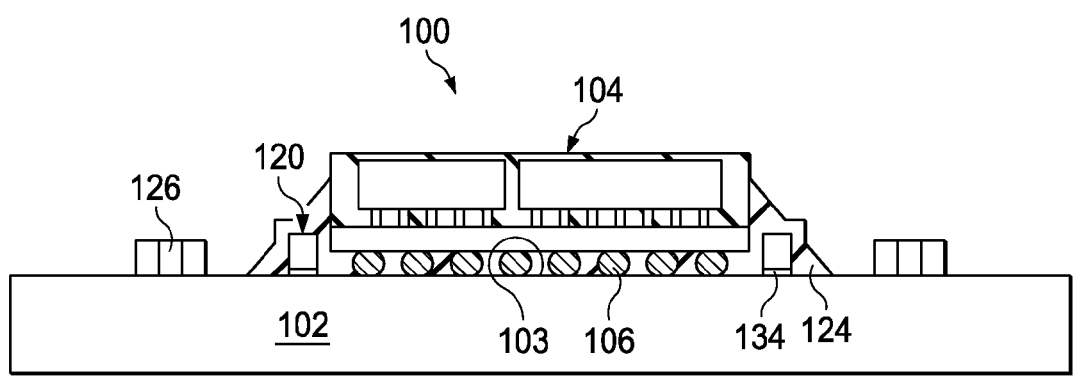
Figure 11:
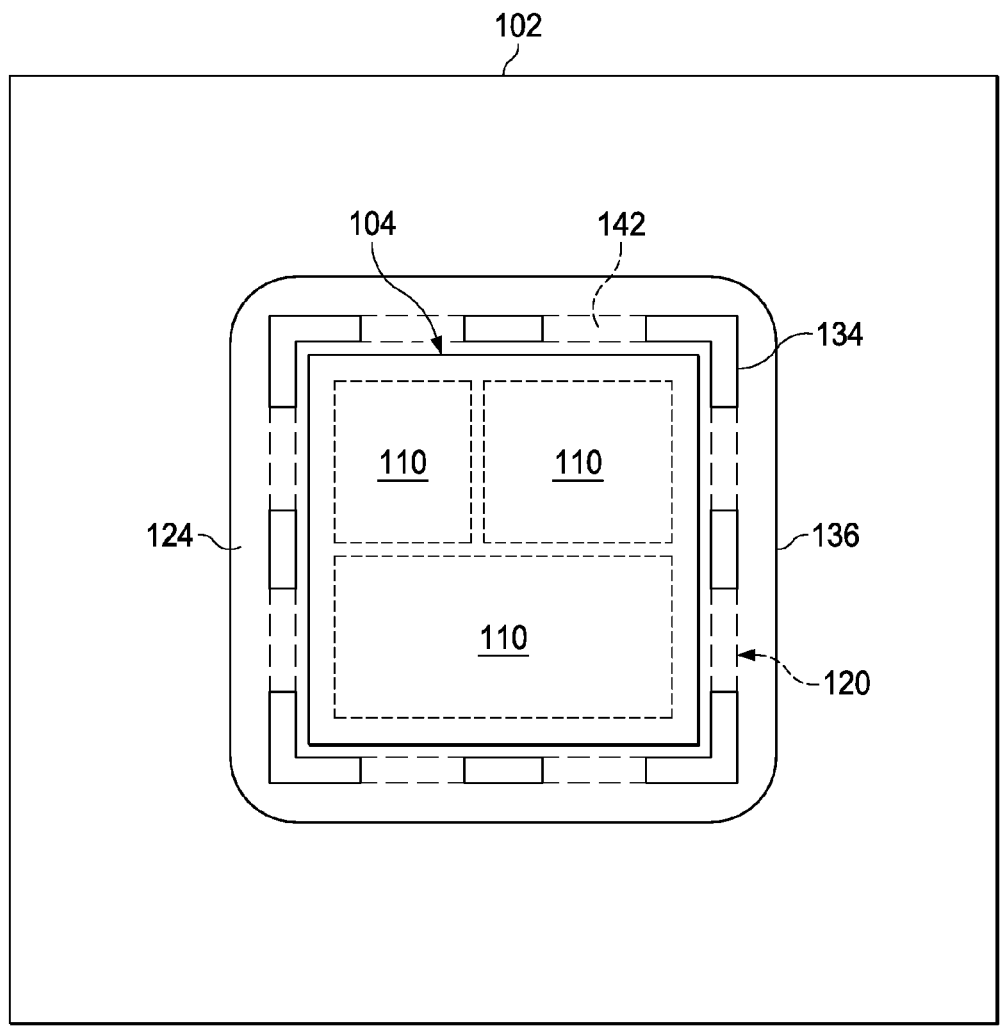

FIGS. 6, 7, and 11 are top views and FIGS. 8, 9, 10, and 12 are cross-sectional views of a method of packaging a semiconductor device 104 at various stages in accordance with some embodiments, wherein the SIS 120 is attached to the packaging substrate 102 before a semiconductor device 104 is attached to the packaging substrate 102. In FIG. 6, an adhesive 134 is applied to the packaging substrate 102 in a region where the SIS 120 will be attached (e.g., around the semiconductor device mounting region 103). In FIGS. 7 and 8, the SIS 120 is attached to the adhesive 134. The adhesive 134 comprises a high transition temperature (Tg) adhesive in some embodiments. For example, the adhesive 134 may have a Tg temperature of about 70° C. to about 150° C. in some embodiments. Alternatively, other types of adhesives 134 may be used. The adhesive 134 may be applied only at the corners of the SIS 120, or at the corners and also at one or more locations along the sides of the SIS 120, as illustrated in FIGS. 6 and 7. The adhesive 134 may also be applied to the packaging substrate 102 where the SIS 120 will be attached, along the entire continuous ring portion 142 (see FIG. 2) of the SIS 120, in other embodiments, not shown. In other embodiments, the adhesive 134 is applied to portions or the entirety of a perimeter of or portions of the SIS 120 rather than (or in addition to) to the packaging substrate 102.

The semiconductor device 104 is then coupled to the semiconductor device mounting region 103, as shown in FIG. 9. An underfill material 124 is applied, and passive components 126 are attached to the packaging substrate 102, as shown in FIG. 10. The SIS 120 is bonded to the packaging substrate 102 by the adhesive 134, or by both the adhesive 134 and the underfill material 124. For example, if the SIS 120 is bonded to corner regions and mid-regions along the continuous ring 142 portion by the adhesive 134, the other portions of the SIS 120 are bonded to the packaging substrate 102 by the underfill material 124.

Figure 12:
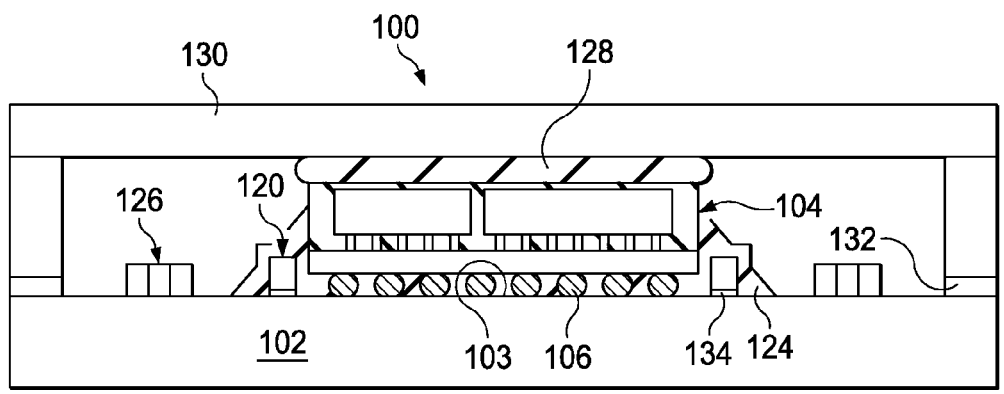

FIG. 11 shows a top view of a portion of the packaged semiconductor device 100 after the underfill material 124 is applied. A plurality of integrated circuit dies 110 of the semiconductor device 104 are shown in phantom (e.g., in dashed lines). The SIS 120 resides within an underfill enclosure region 136 of the packaging substrate 102. FIG. 12 illustrates the completed packaged semiconductor device 100 after the application of the TIM 128 and installation of the cover 130. The cover 130 is attached to a perimeter of the packaging substrate 102 by an adhesive 132, and the adhesive 132 is cured.

Figure 13:
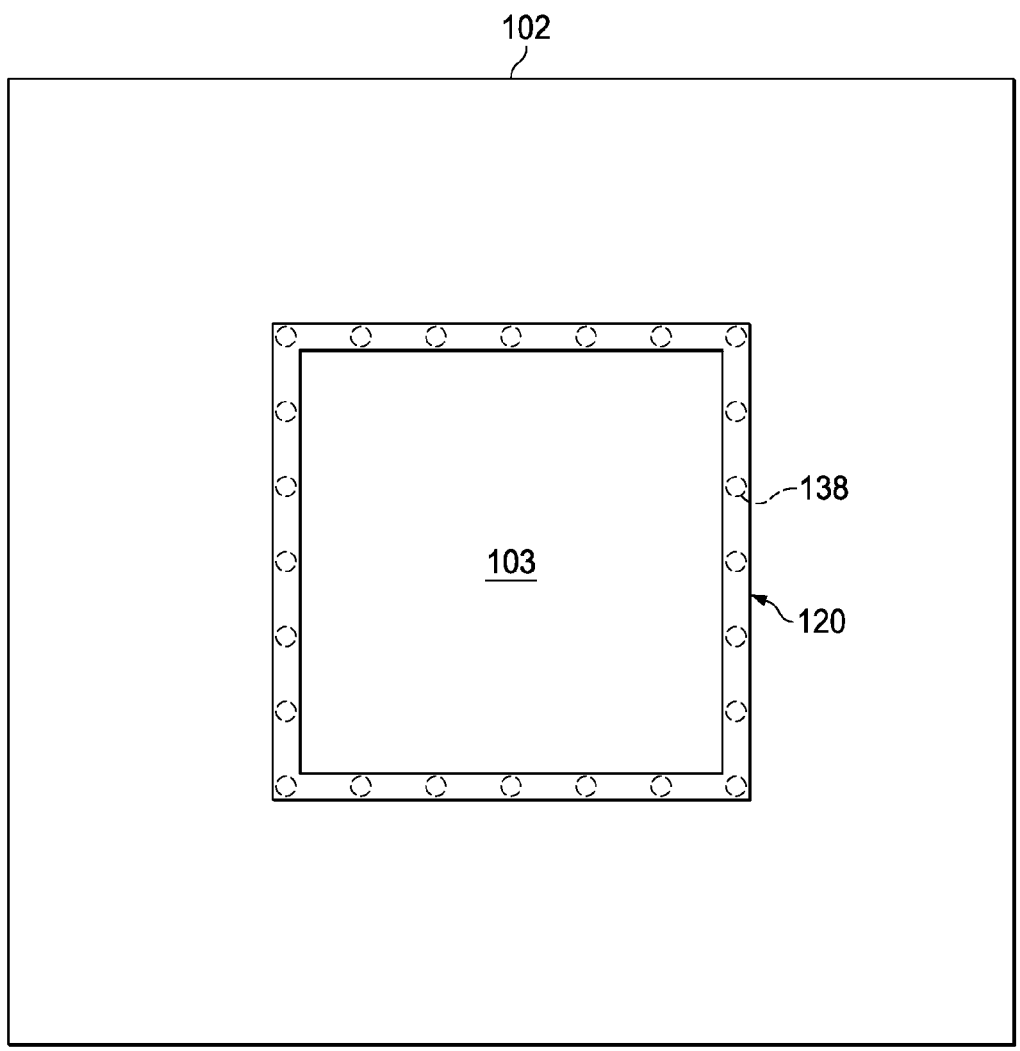
FIGS. 13 and 15 are top views and FIGS. 14 and 16 are cross-sectional views of a method of packaging a semiconductor device at various stages in accordance with some embodiments.
Figure 14:
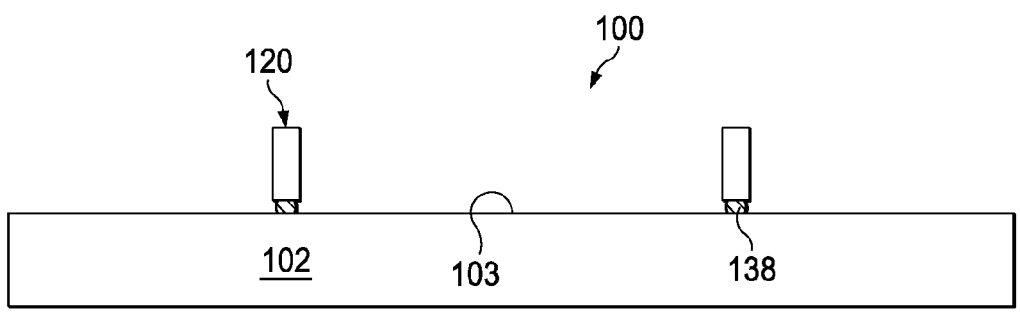
Figure 15:
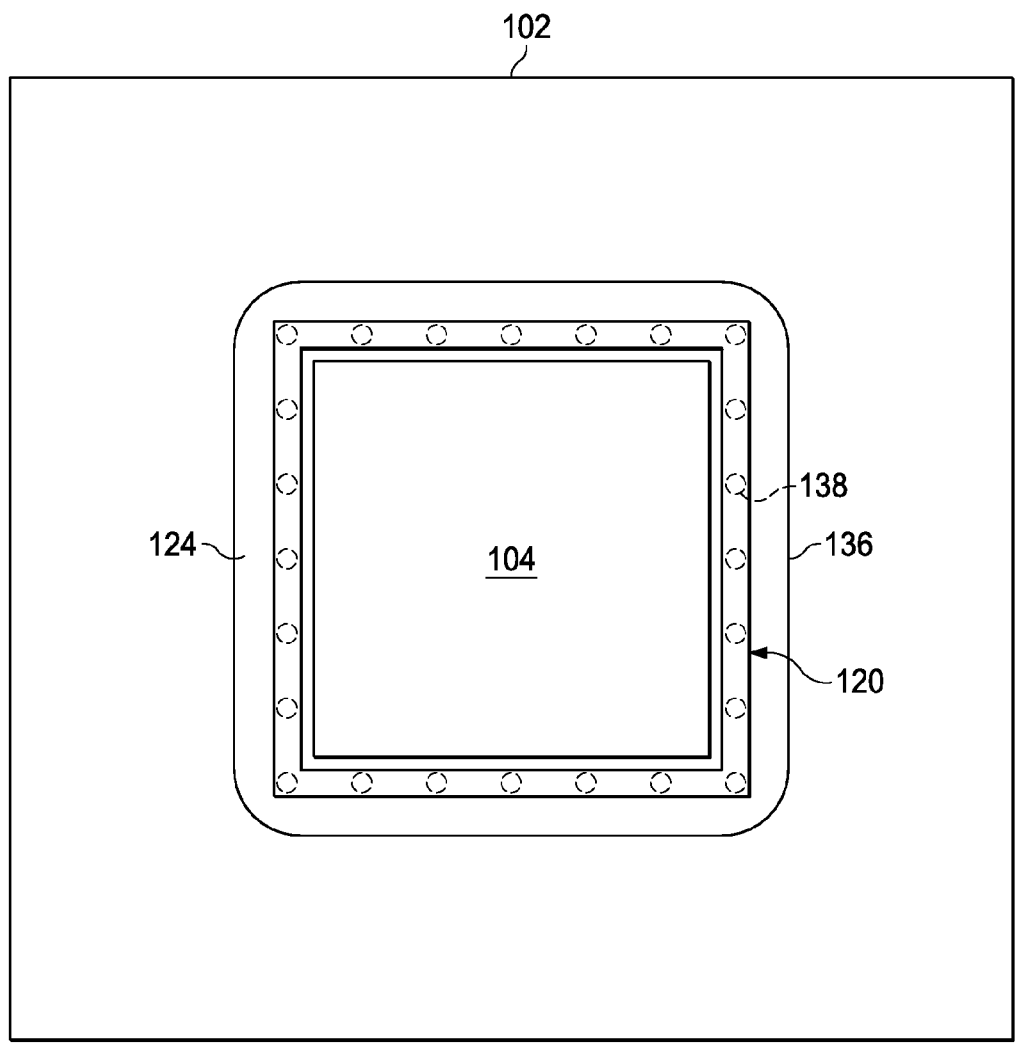
Figure 16:
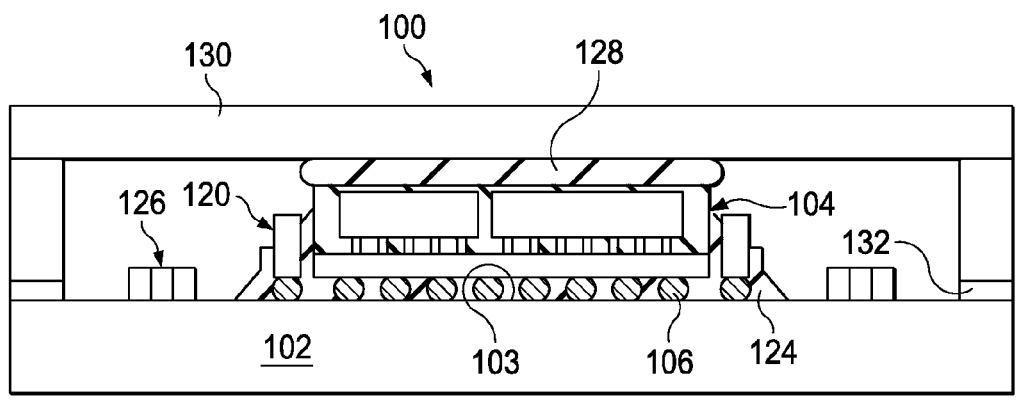

FIGS. 13 and 15 are top views and FIGS. 14 and 16 are cross-sectional views of a method of packaging a semiconductor device 104 at various stages in accordance with some embodiments. The SIS 120 is attached to the packaging substrate 102 by solder 138. The solder 138 comprises a high melting temperature solder that is adapted to re-flow at a temperature of about 210° C. to about 310° C. in some embodiments, for example. Alternatively, other types of solder 138 may be used. The solder 138 is applied at predetermined locations which may comprise a plurality of contact pads disposed on the packaging substrate 102 in some embodiments. The SIS 120 is then attached to the solder 138, and a re-flow process is performed to re-flow the solder 138 and attach the SIS 120 to the packaging substrate 102 using the solder 138. An underfill material 124 is applied beneath the semiconductor device 104 which comprises a CoW device 104 in some embodiments as shown in FIGS. 15 and 16, and passive components 126 are attached to the packaging substrate 102. The underfill material 124 is applied beneath the semiconductor device 104 after the SIS 120 is coupled onto the packaging substrate 102 in these embodiments, for example. The solder 138, or both the solder 138 and the underfill material 124, adhere the SIS 120 to the packaging substrate 102. A more detailed view of the SIS 120 coupled to the packaging substrate 102 is shown in FIG. 15 after the application of the underfill material 124. The SIS 120 resides within an underfill enclosure region 136 of the packaging substrate 102. FIG. 16 illustrates the completed packaged semiconductor device 100 after the application of the TIM 128 and the installation of the cover 130.

FIGS. 17 through 26 illustrate various shapes and configurations of SIS's 120 in accordance with some embodiments of the present disclosure. FIGS. 17, 20, 21, 23, and 24 are top views and FIGS. 18, 19, 22, 25, and 26 are perspective views of SIS's 120 in accordance with some embodiments. The SIS's 120 can be coupled to a packaging substrate 102 by an adhesive, a high-Tg adhesive having a transition temperature (Tg) of about 70° C. to about 150° C., solder, an underfill material 124 such as a C4 bump underfill material, an epoxy-based material, and/or a combination thereof, for example.

Figure 17:
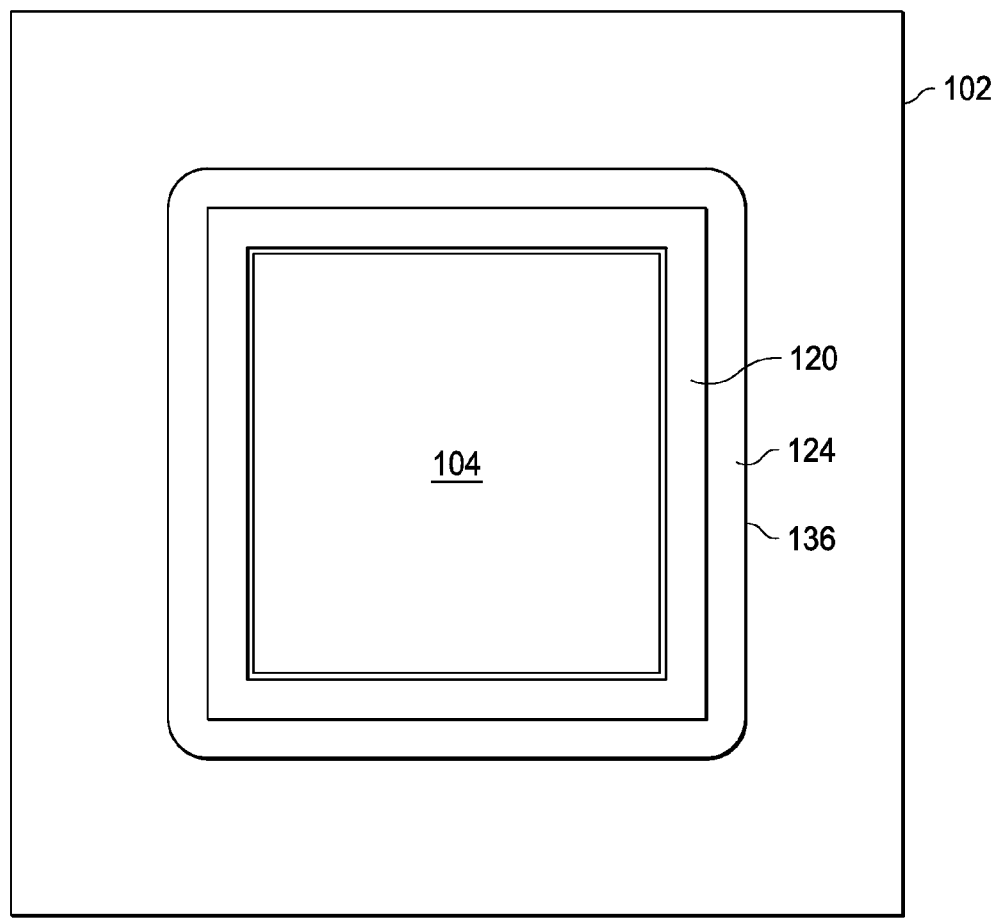
FIG. 17 is a top view and FIG. 18 is a perspective view of a stress isolation structure (SIS) of a packaging device in accordance with some embodiments.
Figure 18:
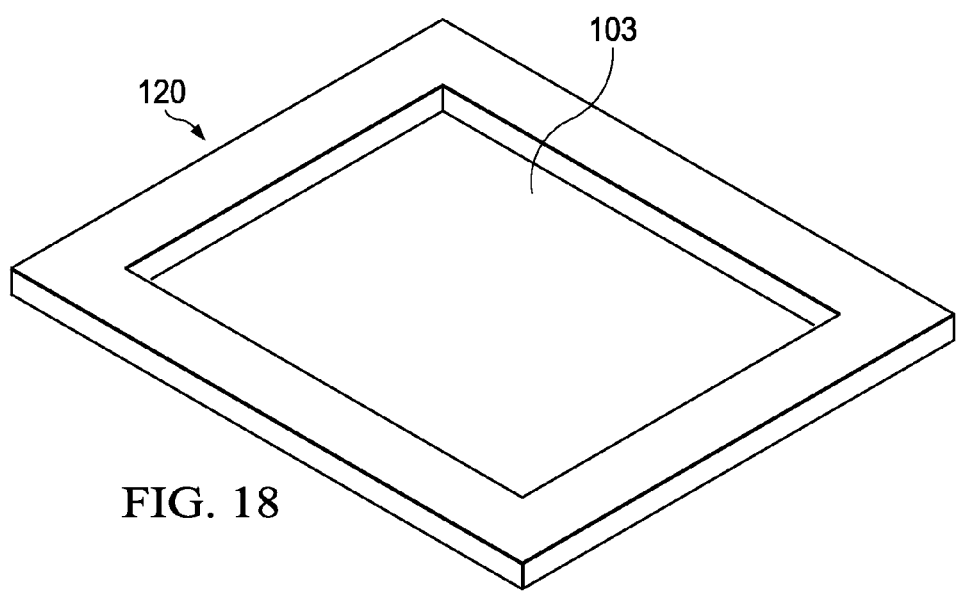
Figure 19:
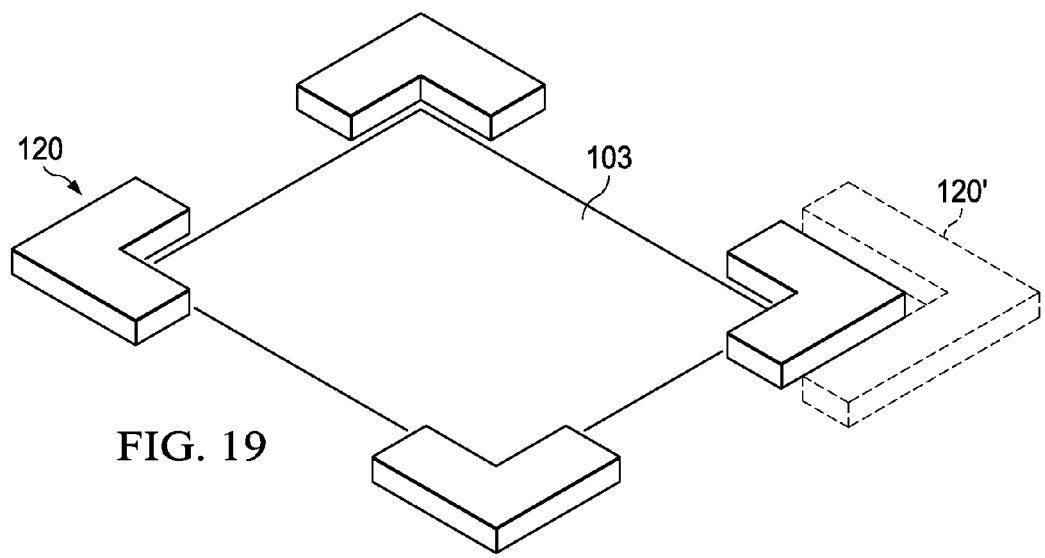
FIGS. 19, 22, 25, and 26 are perspective views
Figure 25:
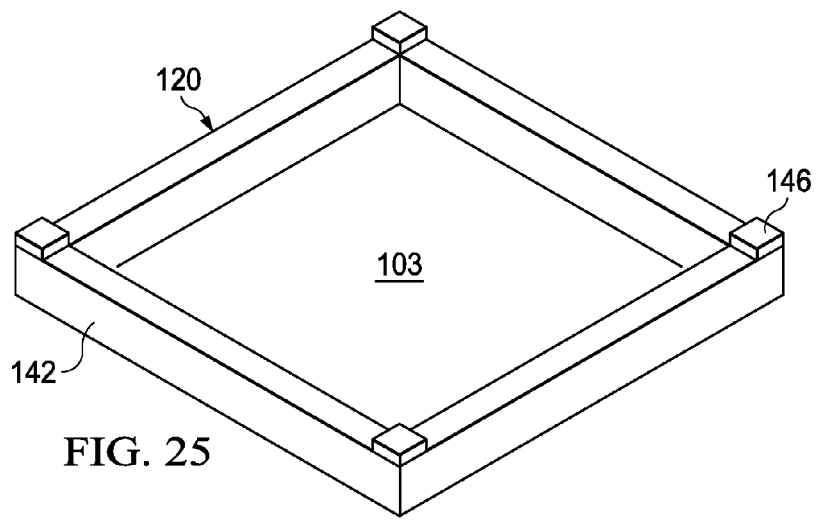

In FIGS. 17 and 18, the SIS 120 comprises a continuous ring disposed around the perimeter of the semiconductor device mounting region 103. The SIS 120 comprises a full periphery frame in some embodiments, for example. The SIS 120 may include downwardly-extending regions 122, as shown in FIG. 2, and/or upwardly-extending regions 146, as shown in FIG. 25, to be described further herein. The SIS 120 may alternatively comprise a partial ring around the perimeter of the semiconductor device mounting region 103. For example, in FIG. 19, the SIS 120 comprises an L-shaped beam proximate each corner of the perimeter of the semiconductor device mounting region 103. An L-shaped beam may be positioned in each of the four corners of the semiconductor device mounting region 103. In other embodiments, the SIS 120 may include a plurality of L-shaped beams 120 and 120' proximate each corner of the perimeter of the semiconductor device mounting region 103, shown in phantom (e.g., in dashed lines) in FIG. 19. Only two L-shaped beams 120 and 120' are shown in FIG. 19 in one corner; alternatively, the SIS 120 may comprise three or more L-shaped beams 120 and 120' in one or more corners.

Figure 20:
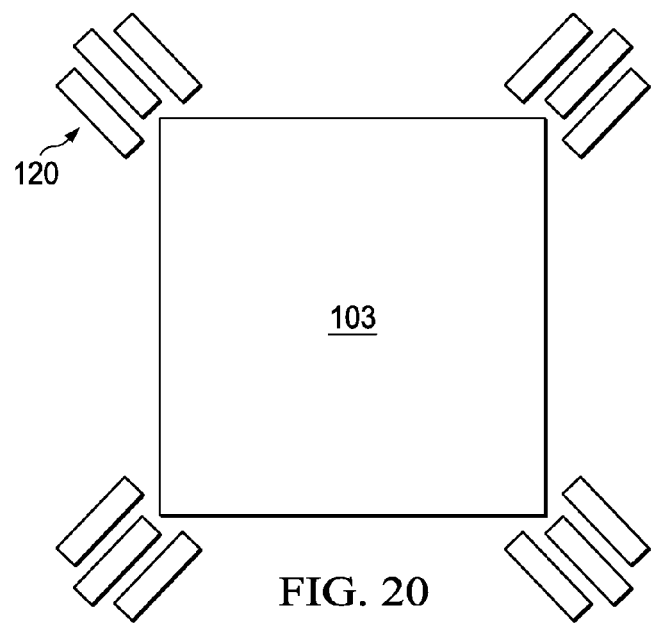
FIGS. 20, 21, 23, and 24 are top views of various shapes and configurations of SIS's in accordance with some embodiments.
Figure 21:
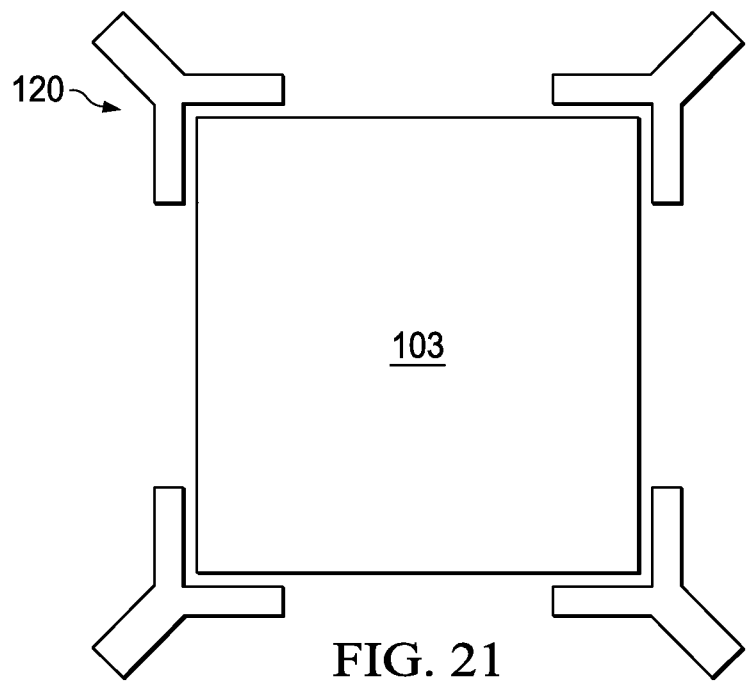
Figure 22:
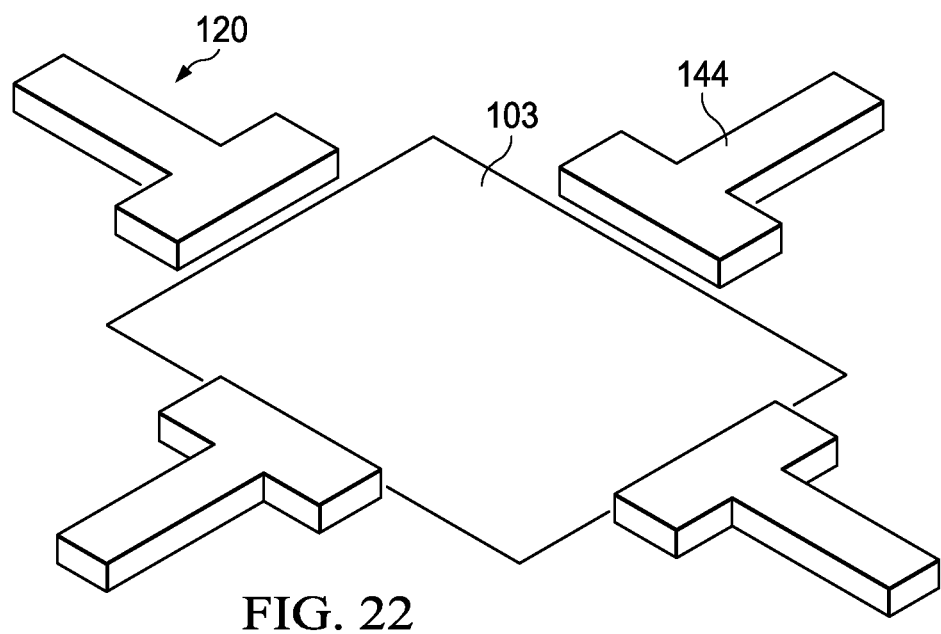

In other embodiments, the SIS 120 comprises a plurality of diagonal strips that radiate away from each corner of the perimeter of the semiconductor device mounting region 103, as shown in FIG. 20. In FIG. 21, the SIS 120 comprises a fork-shaped beam proximate each corner of the perimeter of the semiconductor device mounting region 103. Alternatively, the SIS 120 may comprise a Y-shaped beam proximate each corner of the perimeter of the semiconductor device mounting region 103, also shown in FIG. 21. In other embodiments, the SIS 120 comprises a T-shaped beam 144 proximate each side of the semiconductor device mounting region 103, as illustrated in FIG. 22.

Figure 23:
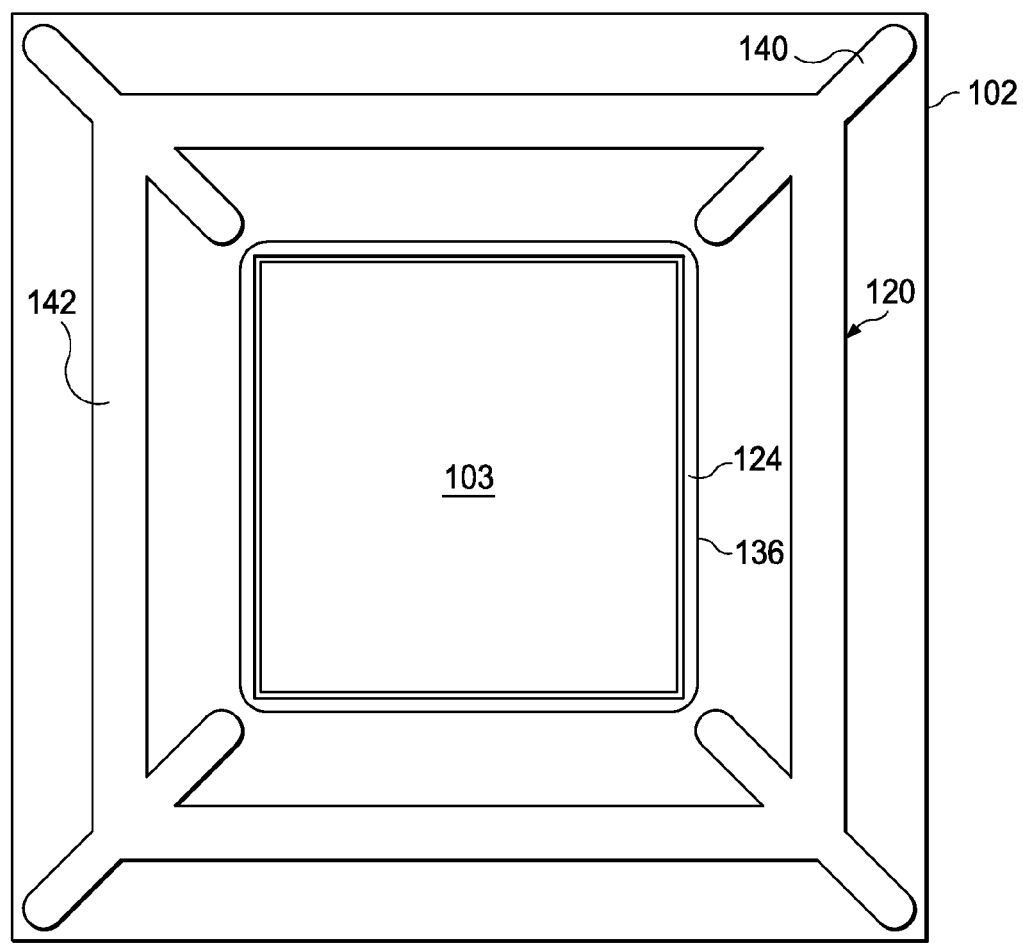

In some embodiments, the SIS 120 comprises a continuous ring 142 portion and may include a diagonal beam 140 proximate each corner of the perimeter of the semiconductor device mounting region 103, as shown in FIG. 23. The continuous ring 142 may comprise a medium ring positioned about halfway between an edge of the semiconductor device mounting region 103 and an edge of the packaging device 102.

The SIS 120 may alternatively comprise a combination of the various shapes and configurations described herein. For example, in FIG. 24, the SIS 120 includes a continuous ring 142 and a T-shaped beam 144 proximate each side of the semiconductor device mounting region 103. The SIS 120 includes a T-shaped beam 144 in each corner of the packaging substrate 102.

The semiconductor device mounting region 103 is oriented in a same orientation as the packaging substrate 102 in the embodiments shown in FIGS. 17 through 23. The semiconductor device mounting region 103 is oriented in a different orientation than the packaging substrate 102 in the embodiment shown in FIG. 24. For example, the semiconductor device mounting region 103 is oriented at an angle α relative to an orientation of the packaging substrate 102, wherein angle α comprises substantially about 45 degrees, in some embodiments. Angle α comprises substantially about 135 degrees in other embodiments. Alternatively, the semiconductor device mounting region 103 may be oriented at other angles with respect to the orientation of the packaging substrate 102. The semiconductor device mounting region 103 comprises a chip-on-wafer (CoW) device mounting region that is oriented at an angle of about 45 to about 135 degrees with a respect to the orientation of the packaging substrate 102 in accordance with some embodiments, as another example.

Figure 24:
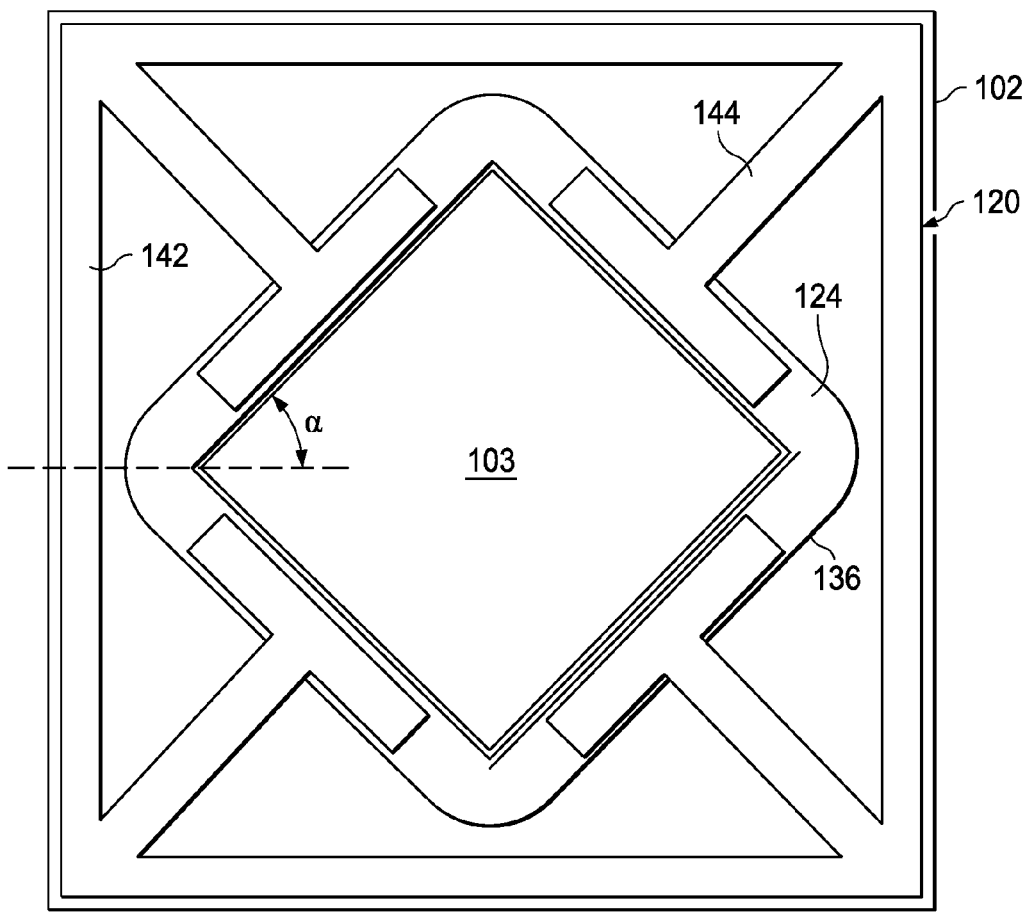

FIGS. 23 and 24 illustrate embodiments wherein at least a portion of the SIS 120 is disposed outside of an underfill enclosure region 136 of the packaging substrate 102. In FIG. 23, the SIS 120 is disposed completely outside the underfill enclosure region 136. In FIG. 24, portions of the T-shaped beams 144 are disposed within the underfill enclosure region 136, and other portions of the T-shaped beams 144 and the continuous ring portion 142 are disposed outside the underfill enclosure region 136 of the packaging substrate 102.

Figure 26:
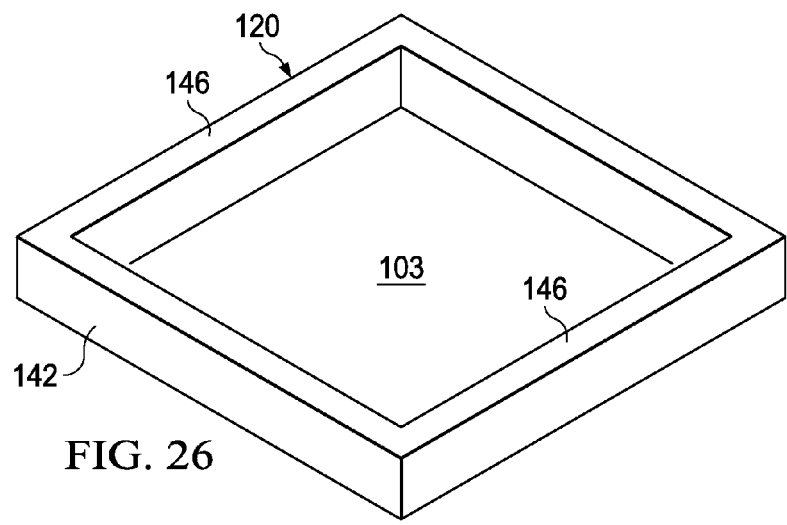
Figure 27:
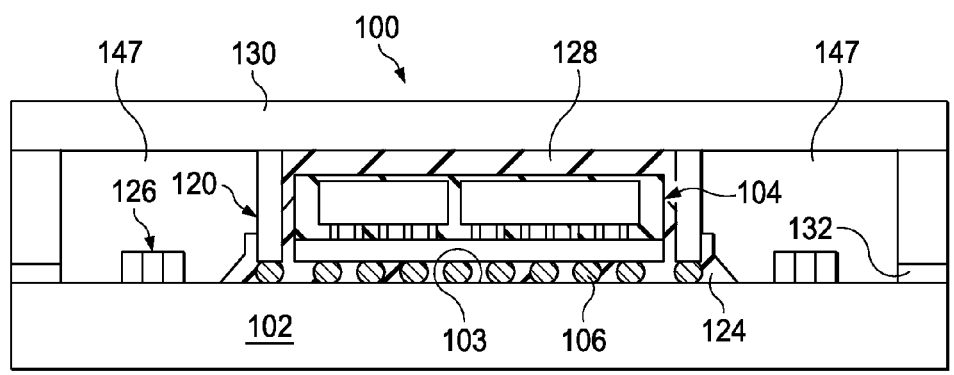
FIG. 27 is a cross-sectional view of a packaged semiconductor device in accordance with some embodiments.

In some embodiments, the corners of the SIS 120 include upwardly extending portions 146, as shown in FIG. 25. The upwardly extending portions 146 extend upwardly away from the continuous ring 142 portion of the SIS 120 in the embodiment shown in FIG. 25, for example. The upwardly extending portions 146 comprise TIM 128 corner protrusion stoppers in some embodiments. In other embodiments, the entire SIS 120 includes upwardly extending portions 146, as shown in FIG. 26. The SIS 120 includes the upwardly extending portions 146 along the entire periphery, for example. The upwardly extending portions 146 shown in FIGS. 25 and 26 are advantageous because they function to contain the TIM 128, preventing the TIM 128 from overflowing into an inner region 147 of the packaged semiconductor device 100, as illustrated in FIG. 27, which is a cross-sectional view of a packaged semiconductor device 100 in accordance with some embodiments. The SIS 120 or portions thereof function as a stopper for the TIM 128 in these embodiments, for example. The upwardly extending portions 146 of the SIS 120 ensure integrity of the TIM 128, such as TIM 128 bond line thickness (BLT) uniformity and interfacial contact quality.

Figure 28:
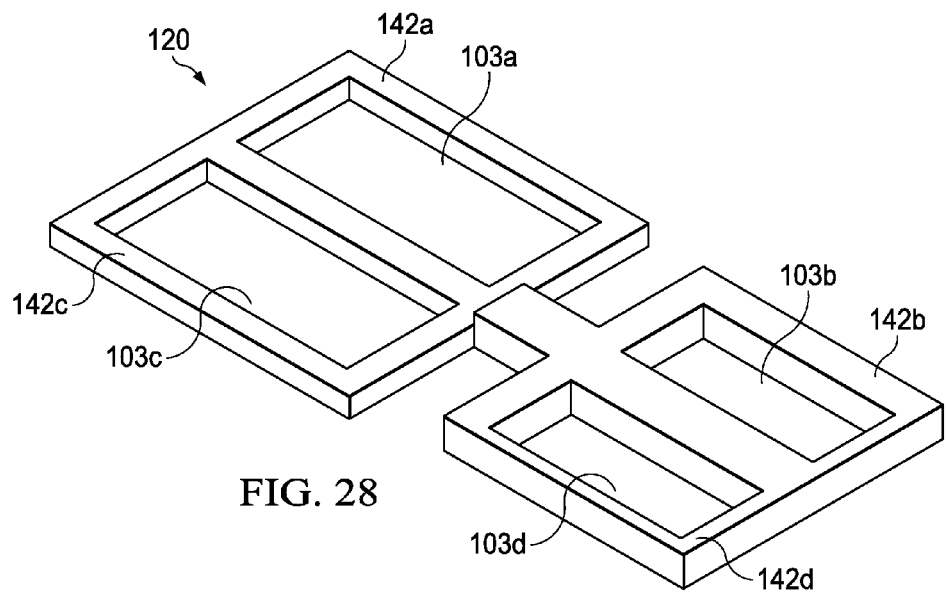
FIG. 28 is a perspective view and FIG. 29 is a top view of an SIS in accordance with some embodiments.
Figure 29:
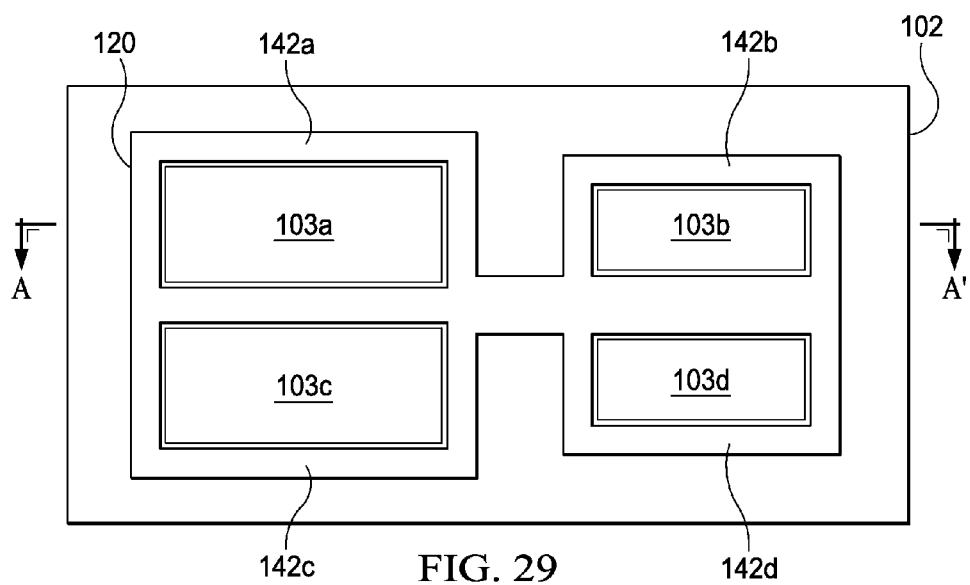

FIG. 28 is a perspective view and FIG. 29 is a top view of an SIS 120 in accordance with other embodiments. The SIS 120 includes a plurality of continuous ring portions 142a, 142b, 142c, and 142d. The packaging substrate 102 includes a plurality of semiconductor device mounting regions 103a, 103b, 103c, and 103d. The SIS 120 includes portions that are disposed proximate a perimeter of each of the semiconductor device mounting regions 103a, 103b, 103c, and 103d. For example, continuous ring portion 142a is disposed around a perimeter of semiconductor device mounting region 103a, and continuous ring portion 142b is disposed around a perimeter of semiconductor device mounting region 103b. Likewise, continuous ring portion 142c is disposed around a perimeter of semiconductor device mounting region 103c, and continuous ring portion 142d is disposed around a perimeter of semiconductor device mounting region 103d.

Figure 30:
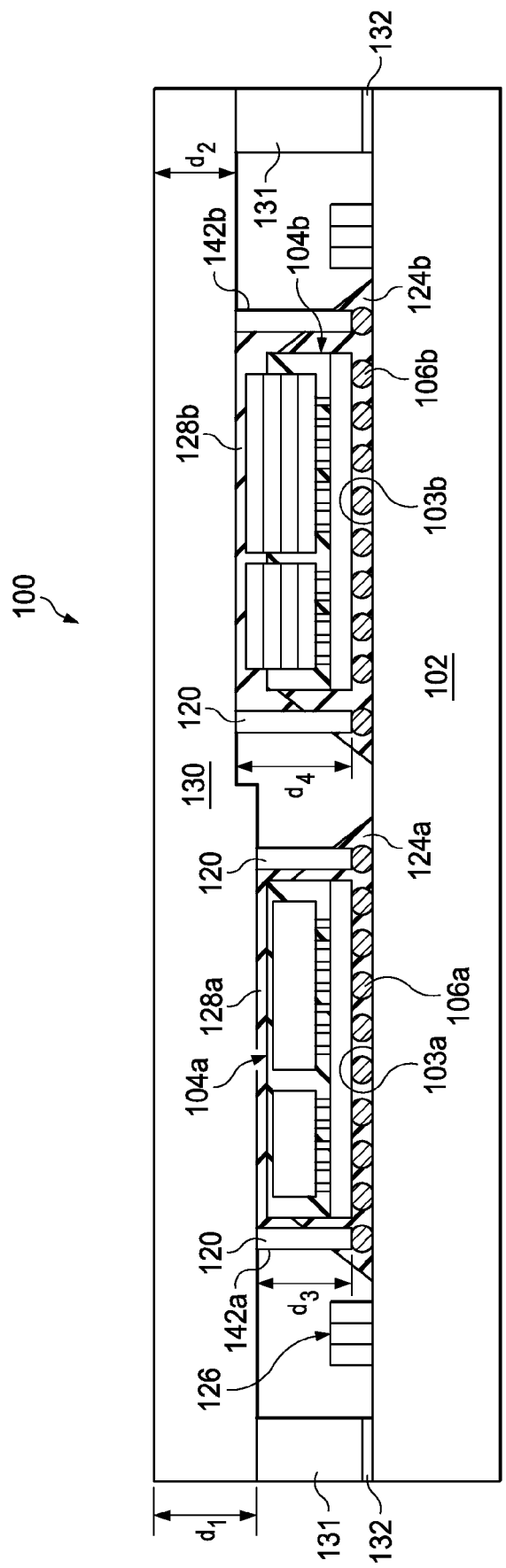
FIG. 30 is a cross-sectional view of a packaged semiconductor device including the SIS shown in FIGS. 28 and 29.

In some embodiments, the SIS 120 is stratified. For example, some semiconductor devices 104a and 104b may comprise different heights, and the cover 130 thickness may be different proximate each semiconductor device 104a and 104b to accommodate the different heights, as shown in FIG. 30. Semiconductor device 104a may comprise a TIS device, and semiconductor device 104b may comprise a TTS device, in some embodiments, for example. The cover 130 comprises a first thickness comprising dimension $d_1$ proximate a first one of a plurality of semiconductor device mounting regions 103a, and the cover 130 comprises a second thickness comprising dimension $d_2$ proximate a second one of the plurality of semiconductor device mounting regions 103b. The second thickness comprising dimension $d_2$ is different than the first thickness comprising dimension $d_1$, in some embodiments, for example. The SIS 120 comprises a first height comprising dimension $d_3$ proximate the first one of the plurality of semiconductor device mounting regions 103a and a second height comprising dimension $d_4$ proximate the second one of the plurality of semiconductor device mounting regions 103b. The second height comprising dimension $d_4$ is different than the first height comprising dimension $d_3$. Dimensions $d_1$, $d_2$, $d_3$, and $d_4$ comprise about 200 μm to about 1,000 μm in some embodiments, for example. Alternatively, dimensions $d_1$, $d_2$, $d_3$, and $d_4$ may comprise other values.

In the embodiment shown in FIG. 30, pressure may be applied when installing the cover 130, and surface contact is maintained between the SIS 120 and the cover 130 while the adhesive 132 and TIM's 128a and 128b are cured. The SIS 120 having the different heights comprising dimensions $d_3$ and $d_4$ function as a TIM 128a and 128b stopper for semiconductor device 104a and 104b, respectively. The cover 130 comprises a customize cover that is adapted to accommodate the varied thicknesses of the semiconductor devices 104a and 104b and the SIS 120.

The cover 130 is not stratified and comprises a single homogeneous thickness in other embodiments. Dimension $d_1$=dimension $d_2$, and dimension $d_3$=dimension $d_4$ in some embodiments, for example.

In FIG. 30, a portion of the SIS 120 may extend fully to the cover 130, or an entirety of the SIS 120 may extend fully to the cover 130. Alternatively, the SIS 120 may extend partially to the cover 130, not shown. The cover 130 includes downwardly extending portions 131 proximate a perimeter of the packaging substrate 102. The cover 130 is coupled to the perimeter of the packaging substrate 102 by an adhesive 132 in the embodiment shown in FIG. 30. The cover 130 functions as a heatsink in some embodiments, for example.

Figure 31:
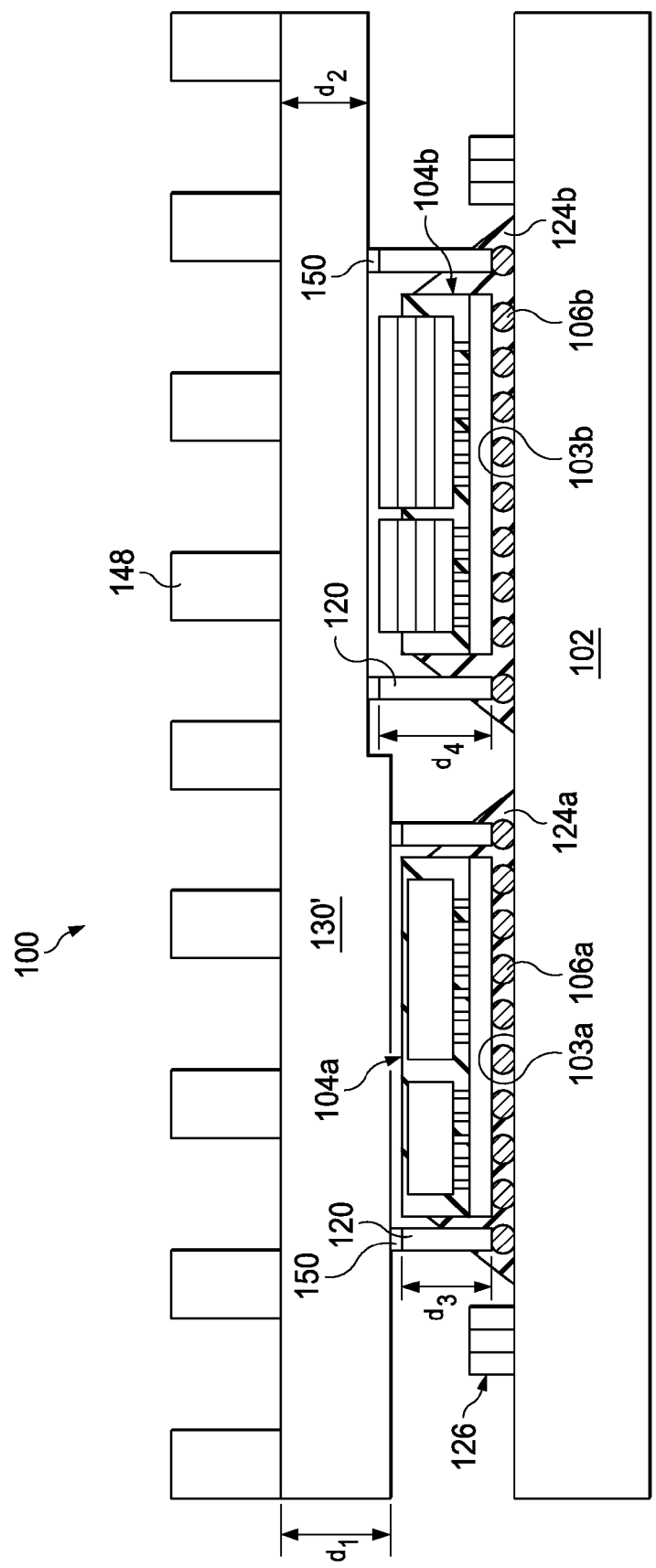
FIGS. 31 and 32 illustrate cross-sectional views of packaged semiconductor devices that include SIS's in accordance with some embodiments.

FIG. 31 is a cross-sectional view of a packaged semiconductor device 100 wherein the cover 130' comprises a heatsink. The cover 130' includes a plurality of upwardly extending fins 148 disposed proximate a top surface thereof. FIG. 31 also illustrates an embodiment wherein the cover 130' comprises different thicknesses comprising dimensions $d_1$ and $d_2$ to accommodate semiconductor devices 104a and 104b having different heights. The SIS 120 is stratified and also comprises different thicknesses comprising dimensions $d_3$ and $d_4$. At least a portion of the SIS 120 extends fully to the cover 130' in some embodiments. In some embodiments, an entirety of the SIS 120 extends fully to the cover 130'. The cover 130' is coupled directly to the SIS 120 in the embodiments shown in FIG. 31. For example, the cover 130' is coupled to the SIS 120 rather than to a perimeter of the packaging substrate 102. Surface contact is maintained between the cover 130' and the SIS 120 in some embodiments while the adhesive 150 is cured, for example. The cover 130' comprises a heat spreader in some embodiments, as another example.

Figure 32:
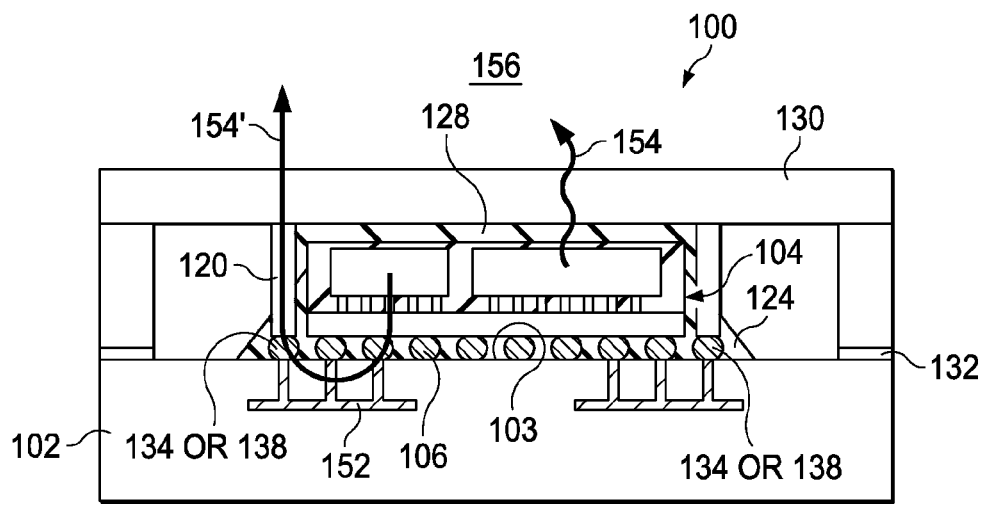

FIG. 32 illustrates a cross-sectional view of a packaged semiconductor device 100 that includes an SIS 120 in accordance with some embodiments. An entirety of the SIS 120 extends fully to the cover 130. A portion of the SIS 120 is coupled to conductive traces 152 within the packaging substrate 102.

During the operation of the packaged semiconductor device 100, a heat flow path 154 of the packaged semiconductor device 100 flows from a semiconductor device 104, through the TIM 128, through the cover 130, and to an exterior region 156 of the packaged semiconductor device 100. The novel SIS 120 of embodiments of the present disclosure provides an alternate heat flow path 154' for the packaged semiconductor device 100. The alternate heat flow path 154' of the packaged semiconductor device 100 flows from the semiconductor device 104, through the conductive bumps 106, through the conductive traces 152 of the packaging substrate 102, through the adhesive 134, solder 138, and/or molding compound 124 that is used to couple the SIS 120 to the packaging substrate 102, through the SIS 120, through the cover 130, and to the exterior region 156 of the packaged semiconductor device 100. Thus, the SIS 120 assists in dissipating heat from the semiconductor device 104.

Figure 33:
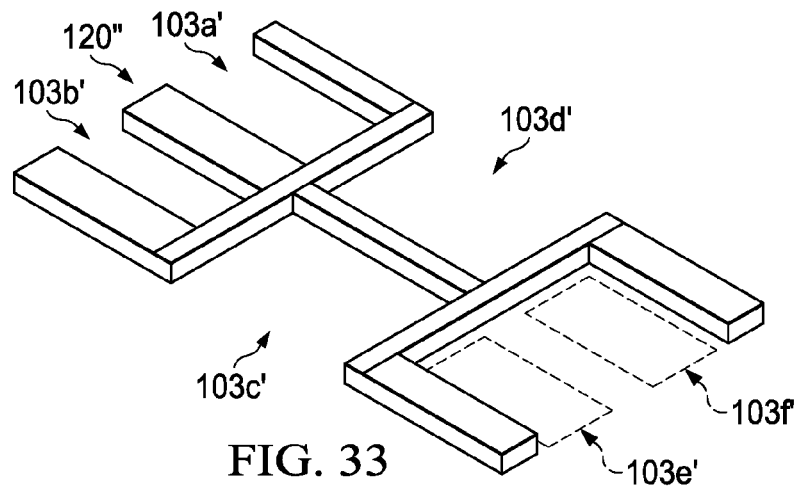
FIGS. 33 and 34 are perspective views of an SIS in accordance with some embodiments.
Figure 34:
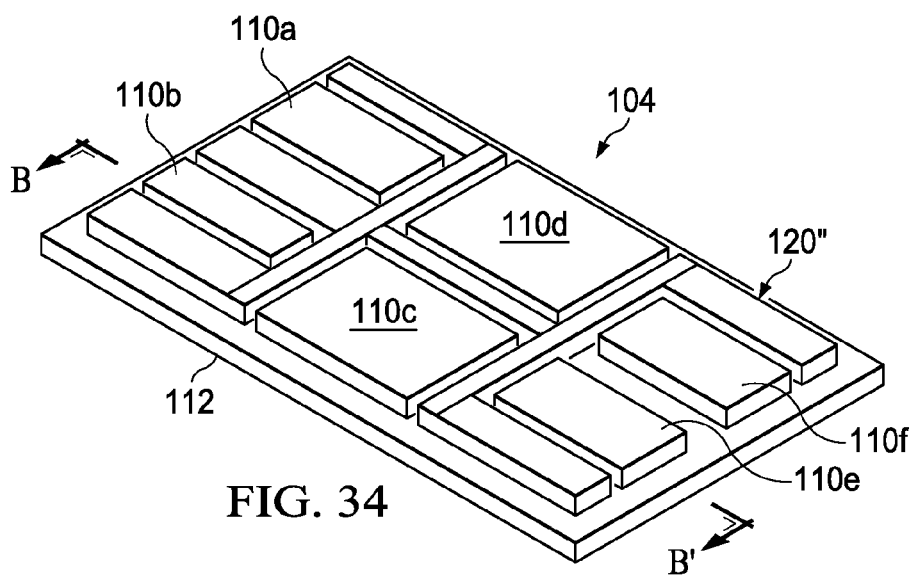

FIGS. 33 and 34 are perspective views of an SIS 120" in accordance with some embodiments. An SIS 120" can be adapted to be implemented in a silicon interposer design to function as a die level SIS 120". The SIS 120" includes a plurality of partial ring portions that are each disposed around a perimeter of a semiconductor device mounting region 103a', 103b', 103c', 103d', 103e', and 103f' as shown in FIG. 33, wherein each semiconductor device mounting region 103a', 103b', 103c', 103d', 103e', and 103f' comprises a die mounting region. FIG. 34 illustrates a semiconductor device 104 including the SIS 120" mounted on an interposer 112. The SIS 120" is disposed partially around each of the integrated circuit dies 110a, 110b, 110c, 110d, 110e, and 110f mounted on the interposer 112 semiconductor device mounting region 103a', 103b', 103c', 103d', 103e', and 103f', respectively. The integrated circuit dies 110a, 110b, 110c, 110d, 110e, and 110f may comprise TIS/TTS stacks disposed on the interposer 112 in some embodiments, for example.

Figure 35:
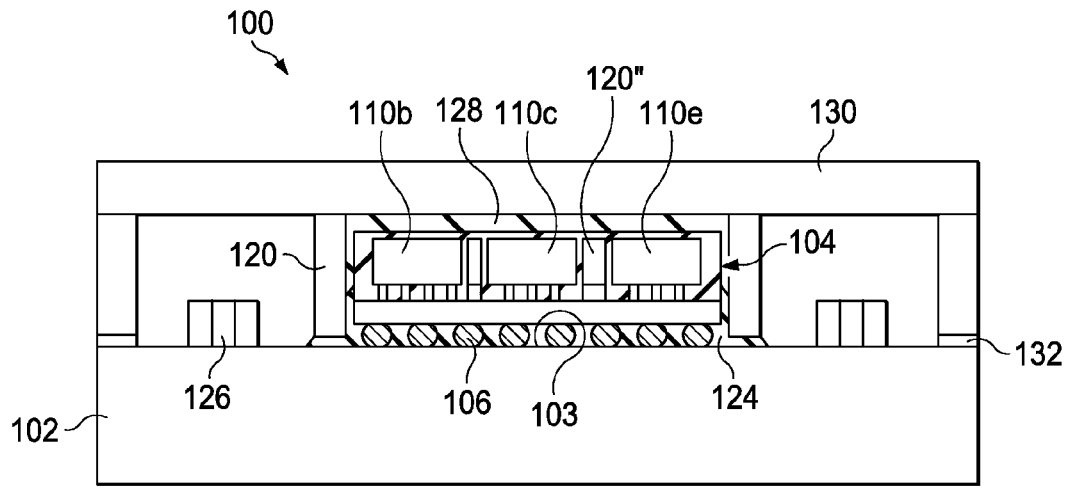
FIG. 35 is a cross-sectional view of a packaged semiconductor device including the SIS shown in FIGS. 33 and 34.

FIG. 35 is a cross-sectional view of a packaged semiconductor device 100 including the SIS 120" shown in FIGS. 33 and 34 at view B-B' of FIG. 34. The SIS 120" is partially disposed around the perimeter of the integrated circuit dies 110b, 110c, and 110e. The SIS 120 disposed around semiconductor device 104 extends fully to the cover 130 and functions as a heatsink and a stopper for the TIM 128. The die level SIS 120" is particularly useful in applications that include multiple stack-up dies in a vertical or planar (e.g., horizontal) direction, which may have a large amount of unoccupied real estate in which the SIS 120" can be implemented.

Figure 36:
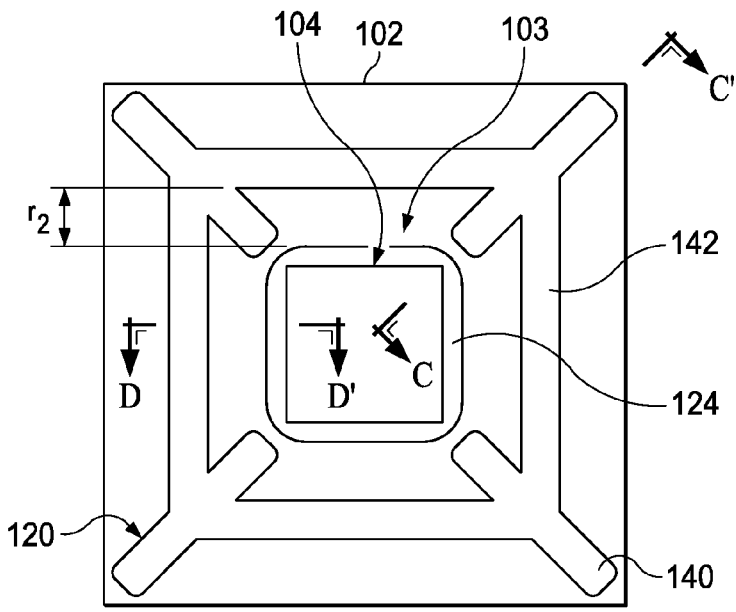
FIG. 36 is a top view and FIGS. 37 and 38 are cross-sectional views of portions of a package for a semiconductor device including an SIS in accordance with some embodiments.
Figure 37:
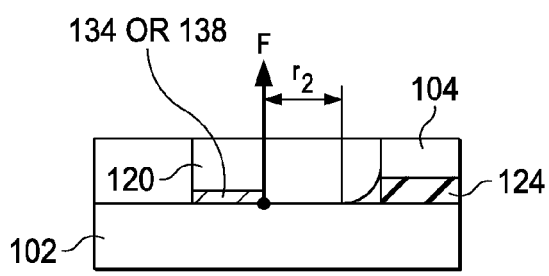
Figure 38:
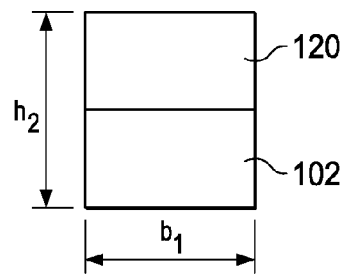

FIG. 36 is a top view and FIGS. 37 and 38 are cross-sectional views of portions of a package for a semiconductor device including an SIS 120 in accordance with some embodiments, illustrating an improvement of both warpage and stress by the inclusion of the SIS 120 in the package. In FIG. 36, the packaging substrate 102 includes an SIS 120 disposed around a semiconductor device 104 that includes an underfill material 124 disposed there-beneath. The SIS 120 comprises a continuous ring 142 portion including a diagonal beam 140 proximate each corner of a perimeter of the semiconductor device mounting region 103. The diagonal beams 140 extend along a length radiating away from the semiconductor device 104 along a view at C-C'. A distance from a continuous ring 142 portion of the SIS 120 and an edge of the semiconductor device 104 along a view at D-D' is shown in FIG. 37. A distance $r_2$ between the SIS 120 and the semiconductor device 104 is minimized, resulting in an increased structural support indicated by the moment of force F in FIG. 37. In FIG. 38, a thickness $h_2$ of the packaging substrate 102 and SIS 120 and a width $b_1$ along a continuous ring 142 portion of the SIS 120 is illustrated.

The maximum normal stress a (e.g., the bending stress) is determinable using Equation 1:

$$\sigma = \frac{Mc}{I}; \quad \text{Eq. 1}$$

wherein c is a perpendicular distance from a neutral axis, wherein I is a moment of inertia of cross-sectional area and is determinable using Equation 2 below, and wherein M is a resultant internal moment about the neutral axis and is determinable using Equation 3 below:

$$I = b_1 h_2^3 / 12; \text{ and} \quad \text{Eq. 2:}$$

$$M = F r_2. \quad \text{Eq. 3:}$$

In Equation 3, F is a moment of force F illustrated in FIG. 37, and $r_2$ is a moment arm comprising a distance from an edge of the SIS 120 to an edge of the molding compound 124 beneath the semiconductor device 104, also illustrated in FIG. 37. In Equation 2, $b_1$ is a width of the SIS 120 as illustrated in FIG. 38, and $h_2$ is a total height of the packaging substrate 102 and the SIS 120 which is also illustrated in FIG. 38.

The SIS 120 results in structural reinforcement along diagonal and peripheral portions of the packaging substrate 102, which produces a larger moment of inertia I to resist a bending moment and reduce bending stress. Furthermore, the bending moment M is eliminated along a diagonal direction and at the periphery of the packaging substrate 102. As a result, the bending stress (σ) and mechanical warpage induced to the entire package structure is minimized, thus reducing the risk of structural failure of the semiconductor devices.

Figure 39:
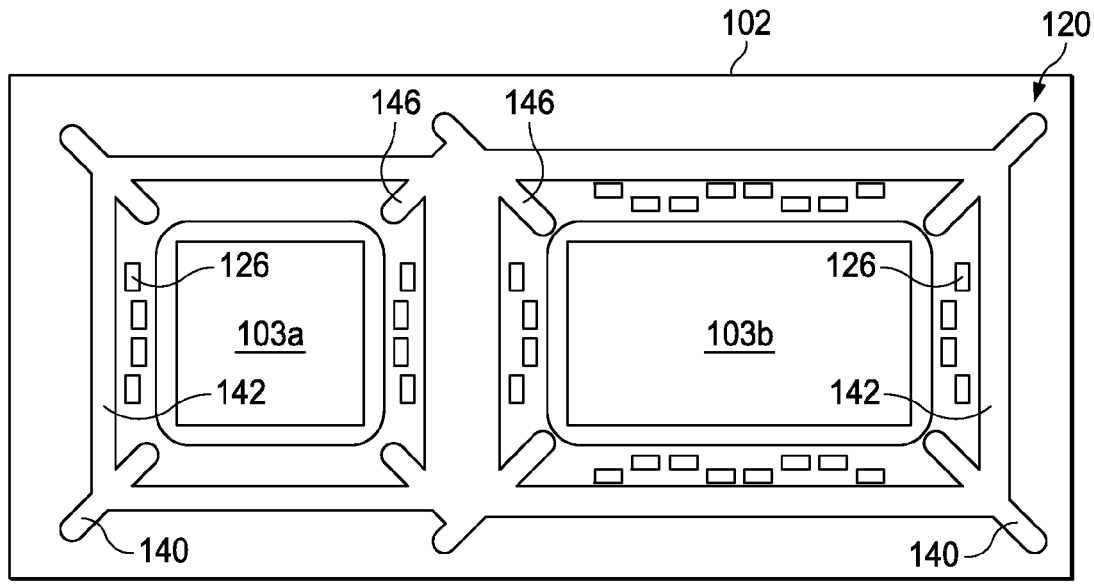
FIG. 39 is a top view of an SIS in accordance with yet other embodiments of the present disclosure.

FIG. 39 is a top view of an SIS 120 in accordance with yet other embodiments of the present disclosure. The SIS 120 disposed on the packaging substrate 102 includes two continuous ring 142 portions including a diagonal beam 140 proximate each corner of the perimeter of the semiconductor device mounting regions 103a and 103b. In some embodiments, an inner region of the diagonal beams 140 includes upwardly extending portions 146 that function as a TIM 128 stopper. In other embodiments, the upwardly extending portions 146 are not included on the SIS 120. One side of the continuous ring 142 portions of the SIS 120 is shared between the semiconductor device mounting regions 103a and 103b. The SIS 120 includes supporting diagonal beams 140, each anchored at one end proximate one of the four corners of the periphery of the semiconductor device mounting regions 103a and 103b. The other end of the supporting diagonal beams 140 along the perimeter of the SIS 120 is anchored proximate the packaging substrate 102 edges or one of the four corners of the packaging substrate 102. The SIS 120 does not interfere with the placement of the passive devices 126 which may comprise surface mount technology (SMT) connections, for example.

Figure 40:
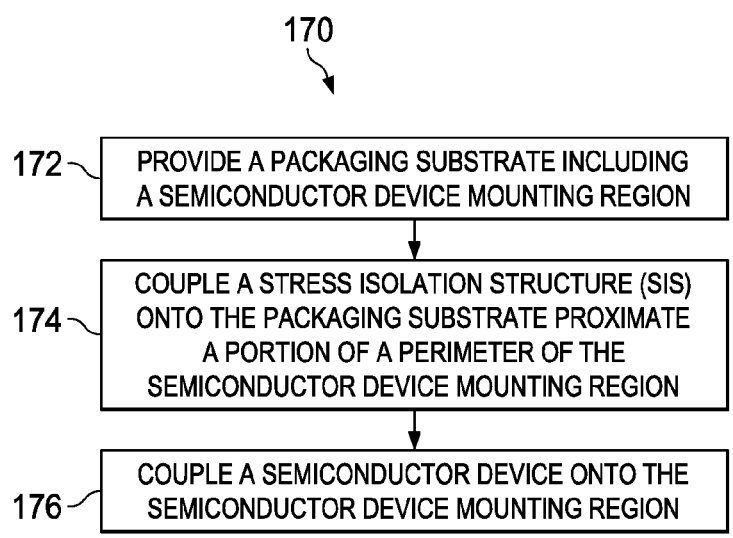
FIG. 40 is a flow chart illustrating a method of packaging a semiconductor device in accordance with some embodiments.

FIG. 40 is a flow chart 170 illustrating a method of packaging a semiconductor device in accordance with some embodiments. In step 172, a packaging substrate 102 is provided that includes a semiconductor device mounting region 103. In step 174, a SIS 120 is coupled onto the packaging substrate 102 proximate a portion of a perimeter of the semiconductor device mounting region 103. In step 176, a semiconductor device 104 is coupled onto the semiconductor device mounting region 103. In some embodiments, the SIS 120 is coupled to the packaging substrate 102 before coupling a semiconductor device 104 onto the semiconductor device mounting region 103. In other embodiments, a semiconductor device 104 is coupled onto a semiconductor device mounting region 103 before the SIS 120 is coupled onto the packaging substrate 102.

Some embodiments of the present disclosure include methods of packaging semiconductor devices, and also include packaging devices that include the novel SIS's 120, 120', and 120" described herein. Some embodiments of the present disclosure also include packaged semiconductor devices 100 that have been packaged using the novel packaging devices and methods described herein.

Advantages of some embodiments of the disclosure include providing novel three dimensional (3D) integrated circuit (IC) packaging with novel stress isolation structures (SIS's) 120 that are integrated into packaging substrates 102. The SIS's 120 provide improved CTE matching between the packaging substrates 102 and the semiconductor devices 104 being packaged, resulting in decreased thermal induced stress, reduced reliability problems, and cost savings. Warping, cracks, underfill material delamination, insulating material damage, and conductive bump cracking are decreased or prevented by implementing the novel SIS's 120 in packaging substrates 102 and other integrated circuit die packaging applications. The SIS's 120 provide an additional or alternative heat transfer path 154' to dissipate heat from the semiconductor devices 104 to a cover 130 or a heatsink 130'. Real estate designs for integrated circuits can be increased by implementing the SIS's 120, due to eliminated or reduced unnecessary keep out zones (KOZ's). The SIS's 120 can be integrated into packaging substrates 102 using various attachment methods, such as adhesive bonding, solder bonding, underfill material 124 bonding, epoxy-based materials, and/or combinations thereof.

In some embodiments, portions of the SIS's 120 function as TIM 128 stoppers, providing improved control of TIM 128 bond line thickness (BLT) and uniformity. The portions of the SIS's 120 that function as TIM 128 stoppers ensure integrity of the TIM 128 and interfacial contact quality. A more uniform TIM 128 is achievable using the SIS's 120 comprising TIM 128 stoppers, resulting in TIM's 128 having a thickness variation of +/− about 5 μm in some applications, for example. Thinner TIM's 128 are also achievable that have a thickness of about 50 μm or less in some applications, as another example.

The SIS's 120 can be implemented for single-time TIM 128/cover 130 processing, to package multiple TIS devices and TTS devices in a single package. Covers comprising heatsinks 130' can be used that are directly attached to the SIS's 120, resulting in improved heatsinking and reduced costs. Alternatively, covers 130 can be attached to a perimeter of the packaging substrates 102 that include the novel SIS's 120. Finite element analysis (FEA) results indicate that warpage can be reduced by about 19 to about 81%, and stress can be reduced by about 2 to about 68% in some applications and designs, by the implementation of the novel SIS's 120 described herein.

The SIS's 120 can also be implemented at a die level and coupled to an interposer (see the embodiments shown in FIGS. 33 through 35). Some embodiments of the present disclosure are particularly useful for packaging multiple stack-up dies in a vertical or planar direction, which may have a large amount of unoccupied real estate in some applications. The novel SIS's 120 can be implemented on the unoccupied semiconductor device real estate, for example. The novel packaging devices including the SIS's 120 have a longer package lifetime, due to the reduced stress and warpage, which results in further cost savings. Furthermore, the novel SIS 120 structures and designs are easily implementable in manufacturing and packaging process flows.

In accordance with some embodiments of the present disclosure, a packaging device for a semiconductor device includes a packaging substrate having a semiconductor device mounting region. The packaging device includes an SIS disposed on the packaging substrate proximate a portion of a perimeter of the semiconductor device mounting region.

In accordance with other embodiments, a packaging device for a semiconductor device includes a packaging substrate having a semiconductor device mounting region, and an SIS disposed on the packaging substrate proximate a portion of a perimeter of the semiconductor device mounting region. The SIS has a CTE close to or substantially the same as a CTE of a material of a semiconductor device. The packaging device includes a cover coupled to a perimeter region of the packaging substrate or to the SIS.

In accordance with other embodiments, a method of packaging a semiconductor device includes providing a packaging substrate including a semiconductor device mounting region, and coupling an SIS onto the packaging substrate proximate a portion of a perimeter of the semiconductor device mounting region. A semiconductor device is coupled onto the semiconductor device mounting region.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaging device for a semiconductor device, comprising:
    a packaging substrate having a first semiconductor device mounted in a first semiconductor device mounting region of the packaging substrate, and a second semiconductor device mounted in a second semiconductor device mounting region;
    a stress isolation structure (SIS) disposed on the packaging substrate proximate a perimeter of each of the first and the second semiconductor device mounting regions; and a cover over the SIS and the packaging substrate, the cover extending beyond a boundary of the SIS, a perimeter portion of the cover being attached to the packaging substrate, the perimeter portion of the cover enclosing the SIS, the cover having a first thickness over the first semiconductor device and a second thickness over the second semiconductor device, the second thickness being different from the first thickness, a composition of the cover being the same along a center axis of the cover, the center axis extending from a lowermost surface of the cover to an uppermost surface of the cover.

2. The packaging device according to claim 1, wherein the SIS comprises a ceramic-based material, a metal-based material, or a glass material.

3. The packaging device according to claim 1, wherein the SIS comprises a material selected from the group consisting essentially of alumina, silicon nitride, silicon carbide, a machinable ceramic material, Invar, Kovar, stainless steel, quartz, graphite, a composite carbon, Cu-Graphite, Cu-tungsten, Cu-alloys, and combinations thereof.

4. The packaging device according to claim 1, wherein the SIS is coupled to the packaging substrate by an adhesive, a high transition temperature (Tg) adhesive having a Tg of about 70° C. to about 150° C., solder, an underfill material, an epoxy-based material, or a combination thereof.

5. The packaging device according to claim 1, wherein the SIS is disposed within or outside of an underfill enclosure region of the packaging substrate.

6. The packaging device according to claim 1, wherein the second semiconductor device mounting region comprises a die mounting region and the packaging substrate comprises an interposer.

7. The packaging device according to claim 1, wherein the SIS comprises a partial ring around the perimeter of the second semiconductor device mounting region, a continuous ring around the perimeter of the second semiconductor device mounting region, an L-shaped beam proximate each corner of the perimeter of the second semiconductor device mounting region, a plurality of L-shaped beams proximate each corner of the perimeter of the second semiconductor device mounting region, a plurality of diagonal strips that radiate away from each corner of the perimeter of the second semiconductor device mounting region, a fork-shaped beam proximate each corner of the perimeter of the second semiconductor device mounting region, a Y-shaped beam proximate each corner of the perimeter of the second semiconductor device mounting region, a T-shaped beam proximate each side of the second semiconductor device mounting region, a continuous ring including a diagonal beam proximate each corner of the perimeter of the second semiconductor device mounting region, or a combination thereof.

8. The packaging device according to claim 1, wherein at least a portion of the SIS extends above a topmost surface of the first semiconductor device.

9. A packaging device for a semiconductor device, comprising:
a packaging substrate having a first semiconductor device and a second semiconductor device mounted in a first semiconductor device mounting region and a second semiconductor device mounting region of the packaging substrate, respectively;
a stress isolation structure (SIS) disposed on the packaging substrate, a portion of the SIS being disposed proximate a perimeter of each of the first and the second semiconductor device mounting regions, the SIS comprising a first height proximate the first semiconductor device mounting region and a second height proximate the second semiconductor device mounting region, the first height being different from the second height; and
a cover attached to a perimeter region of the packaging substrate, the cover having a uniform density, the cover and the packaging substrate forming an enclosed space, the SIS and the first and the second semiconductor devices being contained within the enclosed space.

10. The packaging device according to claim 9, wherein the SIS comprises a coefficient of thermal expansion (CTE) of about 2.8 parts per million per degrees C. (ppm/° C.) to about 10.2 ppm/V.

11. The packaging device according to claim 9, wherein the second semiconductor device mounting region is oriented in a same orientation as the packaging substrate, or wherein the second semiconductor device mounting region is oriented in a direction substantially about 45 or about 135 degrees to an orientation of the packaging substrate.

12. The packaging device according to claim 9, wherein the cover comprises a heatsink, and wherein the cover is coupled to the SIS.

13. The packaging device according to claim 9, wherein the cover comprises a first thickness proximate the first semiconductor device mounting region, wherein the cover comprises a second thickness proximate the second semiconductor device mounting region, the second thickness being different than the first thickness.

14. The packaging device according to claim 9, wherein at least a portion of the SIS is disposed within an underfill enclosure region of the semiconductor device.

15. A semiconductor package, comprising:
a packaging substrate having a semiconductor device mounting region and a conductive trace;
a semiconductor device mounted in the semiconductor device mounting region;
a stress isolation structure (SIS) disposed on the packaging substrate proximate at least a portion of a perimeter of the semiconductor device, a lower surface of the SIS being thermally and electrically coupled to the conductive trace; and
a cover over the SIS and the semiconductor device, a perimeter of the cover being directly attached to the packaging substrate by an adhesive to form an enclosed space, the SIS and the semiconductor device being contained within the enclosed space.

16. The semiconductor package of claim 15, further comprising a thermal interface material (TIM) disposed on a top surface of the semiconductor device, the TIM thermally coupling the semiconductor device to the cover.

17. The semiconductor package of claim 15, wherein the SIS is disposed within an underfill enclosure region of the packaging substrate.

18. The semiconductor package of claim 15, wherein the lower surface of the SIS is coupled to the conductive trace by solder.

19. The semiconductor package of claim 15, further comprising a passive component mounted on an upper surface of the packaging substrate, the passive component being contained within the enclosed space.

20. The semiconductor package of claim 15, wherein the semiconductor device comprises one or more semiconductor dies mounted on an interposer.

* * * * *